United States Patent
Komiya

(10) Patent No.: US 7,176,432 B2
(45) Date of Patent: Feb. 13, 2007

(54) IMAGE DETECTION PROCESSOR AND IMAGE DETECTION PROCESSING METHOD

(75) Inventor: Yasuhiro Komiya, Tokyo (JP)

(73) Assignee: Seiko NPC Corporation (JP)

( * ) Notice: Subject to any disclaimer, the term of this patent is extended or adjusted under 35 U.S.C. 154(b) by 232 days.

(21) Appl. No.: 10/861,218

(22) Filed: Jun. 4, 2004

(65) Prior Publication Data

US 2004/0245435 A1 Dec. 9, 2004

(30) Foreign Application Priority Data

Jun. 6, 2003 (JP) ............................. 2003-161573
Jun. 6, 2003 (JP) ............................. 2003-162793
Jun. 6, 2003 (JP) ............................. 2003-162795

(51) Int. Cl.
*H01L 27/00* (2006.01)

(52) U.S. Cl. ................................. 250/208.1; 382/103
(58) Field of Classification Search ............. 250/208.1, 250/221, 559.4, 203.1; 348/207.99, 222.1; 382/103

See application file for complete search history.

(56) References Cited

U.S. PATENT DOCUMENTS 6,677,569 B2 * 1/2004 Beusch ................... 250/208.1
6,953,924 B2 * 10/2005 Boubal et al. ........... 250/208.1

* cited by examiner

*Primary Examiner*—Kevin Pyo
(74) *Attorney, Agent, or Firm*—Adams & Wilks

(57) ABSTRACT

An image detection processor has a plurality of image detection processing elements arranged on a plane in a matrix array. Each image detection processing element includes an adder circuit that converts an output of a photo detector into digital signals and can receive the digital signals as an input in a matrix form. The adder circuits for respective rows are connected to form cumulative adders. Series adders are connected in series and respectively receive the outputs of final stages of the cumulative adders of respective rows and cumulatively add these outputs. The digital signals are selectively inputted to the cumulative adders using a row decoder and a column decoder and processed data of an image detected by the photo detectors of the plurality of image detection processing elements are outputted from the last series adder. Processed data from the last series adder are inputted to an edge coordinate detector or a status judgment unit.

3 Claims, 18 Drawing Sheets

FIG. 4
(a) 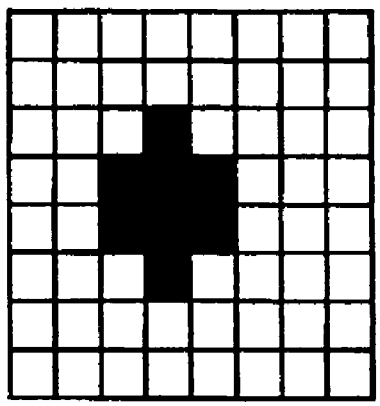
(b) 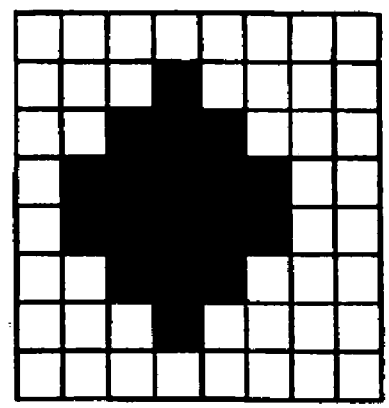

F I G. 1 2
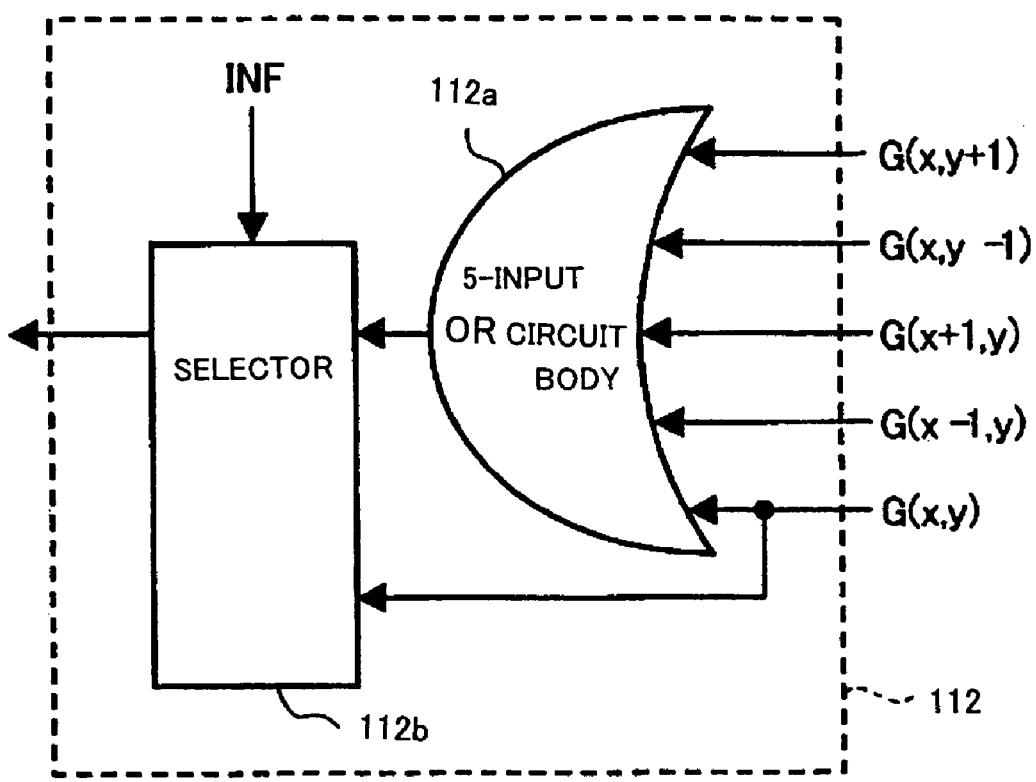

FIG. 18
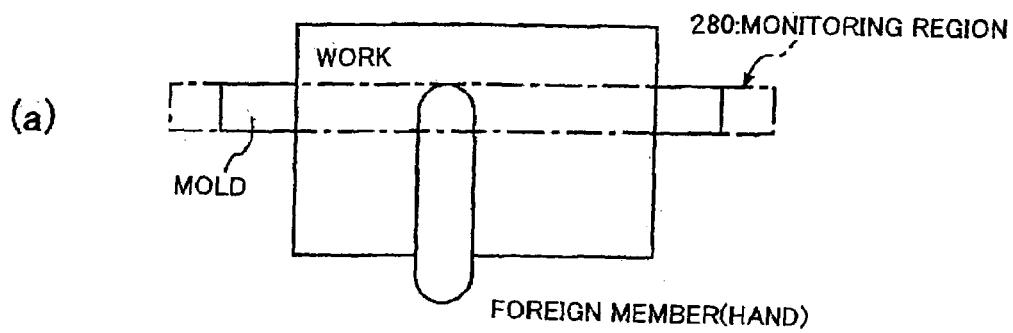
(a)
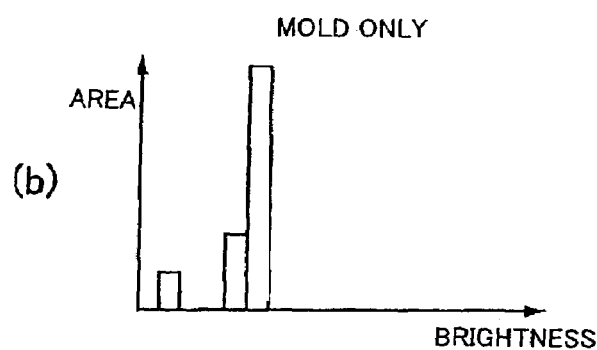
(b)
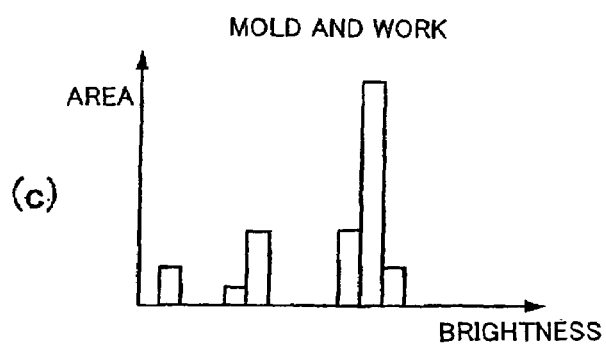
(c)
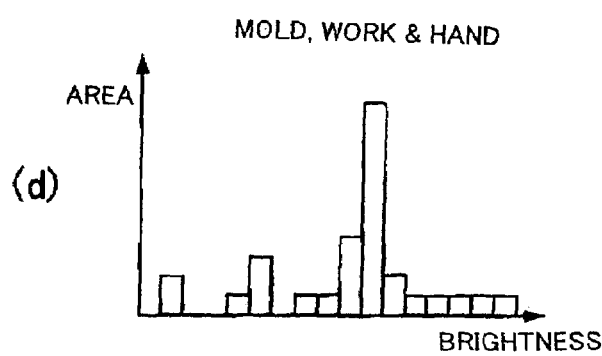
(d)

IMAGE DETECTION PROCESSOR AND IMAGE DETECTION PROCESSING METHOD

BACKGROUND OF THE INVENTION

1. Field of the Invention

The present invention relates to an image detection processor used in various control equipment, recognition devices and information inputting devices, and more particularly to an image detection processor for performing an image processing of a moving object body at a high speed.

2. Related Art Statement

Conventionally, an image processor used in various control equipment, recognition devices and information inputting devices combines a CCD light reception sensor which is used in a video camera or the like and an external processing processor to realize functions thereof. Image data obtained by the CCD light reception sensor is transferred to and stored in a separate memory device and image processing such as the calculation of the centers of gravity of target object is performed through a separate processing processor.

As an image detection processor in a research stage, as described in the Journal of Japan Robot Society (vol. 13, No. 3 Apr., 1995, pages 333–338), a constitution which integrally mounts a light reception sensor and parallel signal processing circuit on one chip and a signal processing such as an edge extraction, a wire size reduction and the like is performed at the sensor side and outputs the result in sequence has been proposed.

Further, in U.S. Pat. No. 7,046,821 which corresponds to Japanese Unexamined Patent Publication 2001-195564 (Patent Document 1), there is disclosed an image detection processor which includes a plurality of image detection processing elements which are arranged in a matrix on a plane. By inputting an image of a moving object body to the image detection processor, a binarized image of the object body can be extracted from a background and an image area and coordinates of center of gravity of the object body can be calculated at a high speed.

SUMMARY OF THE INVENTION

According to one aspect of the present invention, there is provided an image detection processor in which a plurality of image detection processing elements each of which includes a photo detector which performs a photoelectric conversion, a converter which converts signals from the photo detector into digital signals, and an adder which allows inputting of the digital signals thereinto are arranged like a grid in a matrix array and an object body image is focused on the image detection processing elements, wherein the image detection processor further includes cumulative adders which are constituted by sequentially connecting adders in the plurality of image detection processing elements, a control circuit which allows selective inputting of the digital signals to the cumulative adders, and edge coordinate detection means which selects the digital signals of the image detection elements in a row unit or in a column unit of the grid-like arrangement by the control circuit and detects edge coordinate of the object body image based on processed data obtained by the cumulative adders.

Due to such a constitution, it is possible to extract a binarized image of the moving object body from a background and to calculate an image area at a high speed and hence, it is possible to detect edge coordinate or the edge position of the object body which moves in a relatively wide range at a high speed.

According to another aspect of the present invention, there is provided an image detection processor in which a plurality of image detection processing elements each of which includes a photo detector which performs a photoelectric conversion and outputs electric signals corresponding to inputting of light, a converter which converts the electric signal outputted from the photo detector into binarized signals of "0" or "1" selectively using two threshold values of brightness and darkness, and an arithmetic operation means which outputs a first operation result obtained by conjunction operation of a binarized signal converted by one of the threshold values and a comparative object signal and a second operation result obtained by conjunction operation of the first operation result and a binarized signal converted by another threshold value as pixel signals are arranged like a grid on a plane.

According to the above-mentioned constitution of the image detection processor, the converter converts an electric signal from the photo detector into the binarized signals by selectively using two threshold values of relatively large (bright) value and the relatively small (dark) value as the threshold values of contrast for converting the output signal from the photo detector into the binarized signals of "0" or "1", for example. Accordingly, it is unnecessary to perform multi-value signal processing for achieving multi-scales on the output signal from the photo detector and it is possible to use a circuit which is served for the binarized signal processing and hence, the constitution of the image detection processor can be simplified. Further, according to the first aspect of the present invention, the first operation result is obtained by the conjunction operation of the binarized signal converted by one of the threshold values and the comparative object signal and the second operation result which is obtained by the conjunction operation of the first operation result and a binarized signal converted by another threshold value is used as the pixel signal whereby it is possible to perform the image processing of the object body having the intermediate brightness which moves in a background having contrast using the binarization circuit having the simple constitution. Since the circuit constitution is simple, the processing speed can be increased correspondingly.

According to another aspect of the present invention, there is provided an image detection processor in which the comparative object signal is a signal which is obtained by disjunction of the pixel signal of the image detection processing element per se in the grid arrangement and the immediately-before pixel signals of the image detection processing elements arranged at both left and right sides as well as at both upper and lower sides of the image detection processing element.

According to the constitution of the image detection processor of the second aspect of the present invention, by forming the comparative object signal as the disjunction of the pixel signal of the image detection processing element per se and the immediately-before pixel signals of the image detection processing elements arranged at both left and right sides as well as at both upper and lower sides of the image detection processing element, it is possible to extract and process the image of the object body having the intermediate brightness which moves in the background having the contrast.

According to another aspect of the present invention, the converter includes a means which selectively outputs the above-mentioned binarized signals in which one of brightness and darkness is set as "1" and another of brightness and darkness is set as "0" with respect to the threshold value and the above-mentioned binarized signals in which another of brightness and darkness is set as "1" and one of brightness and darkness is set as "0" with respect to the threshold value, wherein the arithmetic operation means includes a selection means which selectively outputs the above-mentioned comparative signal formed of a disjunction of immediate-before holding signals of the image detection processing element per se, the image detection processing elements arranged at both left and right sides as well as at both upper and lower sides of the image detection processing element and the holding signal of the image detection processing element per se, and a holding means which holds conjunction of the holding signal which the selection means outputs and the output signal of the converter as the new holding signal.

According to this image detection processor, the constitution can be simplified. Further, with such a constitution, it is possible to realize the extracting and processing by differentiating the image of the object body having the intermediate brightness moving in the background having darkness and brightness using the simplified processing from the background in which, for example, the first operation result which is obtained by taking the conjunction of the binarized signal from the converter which sets the binarized value such that the threshold value is taken at the dark side and the bright side is set as "1" and the comparison signal which is held by the holding means immediately before is held in the holding means and, thereafter, the second operation result which is obtained by taking the conjunction of the binarized signal from the converter which sets the binarized value such that the threshold value is taken at the bright side and the dark side is set as "1" and the first operation result which is held by the holding means immediately before is set as the pixel signal.

According to another aspect of the present invention, there is provided an image detection processor in which the image detection processing element further includes an adder to which an output of the second arithmetic operation means is given as an input, and the image detection processor further includes cumulative adders which sequentially connect the adders of the plurality of image detection processing elements which are arranged in a grid, a control circuit which selectively allows outputs of the adders of the plurality of image detection processing elements to be inputted to the cumulative adders, and output parts to which processed data outputted from the cumulative adders are supplied based on image data detected by the photo detectors.

Due to the constitution of such an image detection processor, the image detection processing element further includes the adder which adds a pixel signal, the image detection processor further includes the cumulative adders which sequentially connect the adders of the plurality of image detection processing elements arranged like a grid, and the outputs from the adders of the image detection processing elements are selectively inputted to the cumulative adders by the control circuit and hence, it is possible to output data necessary for calculating the position of center of gravity of the image data of the object body detected by the optical detector from the output part. Accordingly, it is possible to calculate, at a high speed, the position of center of gravity of the image of the object body which has the intermediate brightness which moves in the background having the contrast, whereby the image detection processor is applicable to the a controlled machine such as a robot.

Further, by forming the constitution into one chip, the image detection processor may be formed of an integrated circuit.

According to another aspect of the present invention, there is provided an image detection processing method which comprises a step of outputting corresponding electric signals by performing an photoelectric conversion of inputted light at an interval of a given time at a plurality of respective positions which are arranged like a grid on a plane, a step of selecting two threshold values consisting of a bright threshold value and a dark threshold value, a step of converting the electric signals into a binarized signal of "0" or "1" respectively based on the selected threshold value, a first operation processing step of taking conjunction of a pixel signal of an image detection processing element per se, immediately-before pixel signals of image detection processing elements arranged at both left and right sides as well as at both upper and lower sides of the image detection processing element, and a second operation processing step which forms conjunction of the binarized signal which is formed by setting one of the contrast to "1" at another threshold value of the contrast and a result the first operation processing step into the pixel signal of the image detection processing element per se.

According to the constitution of such an image detection processing method, at a plurality of respective positions which are arranged like a grid on a plane, as threshold values for converting the electric signals which are obtained by performing the photoelectric conversion of inputted light at a given time interval into the binarized signal of "0" or "1", two threshold value of brightness and darkness, for example, a relatively large (bright) value and a small (dark) value are used. Then, based on the respective threshold values, the electric signals are converted into the binarized signals by switching such that the bright electric signal assumes "1" and dark electric signal assumes "0" in one step and the bright electric signal assumes "0" and dark electric signal assumes "1" in the next step. In the initial step, the conjunction of the binarized signal and the comparative signal is taken. Then, the conjunction of the result and the binarized signal of next step is taken to form the image signal and hence, it is possible to extract the object having the intermediate brightness. Accordingly, to detect the object body having the intermediate brightness, it is unnecessary to perform the multiple signal processing which exhibits multiple gray scales on the electric signal for detecting the object body having the intermediate brightness which moves in the background having the contrast and hence, a circuit for binarized signals can be used as the circuit applicable to the present invention whereby the circuit can be simplified. Accordingly, it is possible to perform the image processing of the object body having the intermediate brightness which moves in the background having the contrast at a high speed.

According to another aspect of the present invention, there is provided an image detection processing method which further includes a step for simply adding the pixel signals along the arranging direction of the grid array and a step of selectively adding weighting of the pixel signal along the arranging direction of the grid array.

According to such an image detection processing method, by further providing the step for simply adding the pixel signals along the arranging direction of the grid array and the step of selectively adding weighting of the pixel signal along the arranging direction of the grid array, it is possible to obtain data necessary for calculating the position of the center of gravity of image data of the object body. Accordingly, it is possible to calculate the position of the center of gravity of the image of the object body having the intermediate brightness which moves in the background having the contrast at a high speed whereby the method is applicable to a control machine such as a robot.

According to another aspect of the present invention, there is provided an image detection processor in which a plurality of image detection processing elements each including a photo detector which performs photoelectric conversion, a converter which converts signals from the photo detector into digital signals, and adders which allow inputting of the digital signals therein are arranged on a plane, the image detection processor further includes cumulative adders which sequentially connect the adders of the plurality of image detection processing elements, a control circuit which allows the digital signals of the plurality of image detection processing elements to be selectively inputted to the cumulative adders, and a judging means which judges a display state of the image data based on a distribution state of output data which is detected by the photo detector and is indicative of brightness of the image data outputted from the cumulative adders.

According to such an image detection processor, based on the distribution state of output data which is detected by the photo detectors of the plurality of image detection processing elements and is indicative of brightness of the image data outputted from the cumulative adders, it is possible to judge the display state of the image data, for example, whether the image data displays the normal state or the abnormal state. This is because that if the video data which reflects the monitor region such as the danger zone displays the normal state, in many cases, the image data is not changed or, even when the image data is changed, the change is within a given range and hence, there is no change in the distribution state of the output data indicative of the brightness of the image data or even when the distribution state of the output data is changed, the change is within a given range. However, when a part of human body, for example, a human hand enters the region such as the danger zone or the like and is reflected on the image data, the distribution state of the output data indicative of the brightness of the image data is changed. This is because that when a stereoscopically complicated object such as a human hand enters the inside of the monitor region such as a danger zone or the like, a complicated shade is generated and the distribution state of the output data indicative of the brightness of the image data which reflects the region is abnormally changed. Accordingly, based on the distribution data of the output data indicative of the brightness of the image data of the danger zone, it is possible to judge whether the image data of the danger zone displays the normal state or the abnormal state in which a portion of a human body, for example, a hand or the like enters the inside of the danger zone with high accuracy and at a high speed.

According to another aspect of the present invention, there is provided an image detection processor in which the judging means measures a degree of dispersion of the distribution state of the output data indicative of the brightness and judges that the image data displays the abnormal state when the degree of the above-mentioned dispersion is high.

According to such an image detection processor, the degree of dispersion of the distribution state of the output data indicative of the brightness of the image data is measured and it is possible to judge that the image data displays the abnormal state when the degree of dispersion is high. This is because that when a stereoscopically complicated object such as a human hand enters the inside of the monitor region such as the danger zone or the like, a complicated shade is generated and, compared to a case in which only a mold and a forming object material (work) are present in the inside of the region, the dispersion of the distribution state of the output data indicative of the brightness of the image data which reflects the region is increased.

According to another aspect of the present invention, there is provided an image detection processor in which the converter converts the signals from the photo detector into binarized signals based on a plurality of threshold values respectively, the cumulative adders output the output data indicative of the brightness of the image data as the sum of the binarized signals, and the judging means obtains the difference of the sums for respective threshold values, and the distribution state is obtained based on the difference of the sums.

According to such an image detection processor, at the time of converting analogue electric signals from the photo detector into digital signals, the analogue signals are formed into a binarized value of either "0" or "1" using a plurality of threshold values which differ in magnitude respectively. The cumulative adders add the data which is formed into binarized values due to respective threshold values which differ in magnitude with respect to all image detection processing elements to obtain the sum, and the judging means obtain the difference in the sums for every threshold value whereby it is possible to express the brightness of the multiple gray scale of the input image data using the output data of binarized digital signals. As a result, it is possible to use a circuit for binarized digital signals as the circuit of the image detection processor and hence, it is possible to simplify the image detection processor.

BRIEF DESCRIPTION OF THE DRAWINGS

FIGS. 4A and B are explanatory views for explaining the operation of the image detection processor of FIG. 1.

FIG. 12 is an explanatory view for explaining the construction of a 5 input logical addition circuit, which constitutes an essential part of the image detection processor of the present invention.

FIGS. 18A to 18D are brightness histograms of input image using the image detection processor related to other embodiment of the present invention.

DETAILED DESCRIPTION OF THE INVENTION

Figure 1:
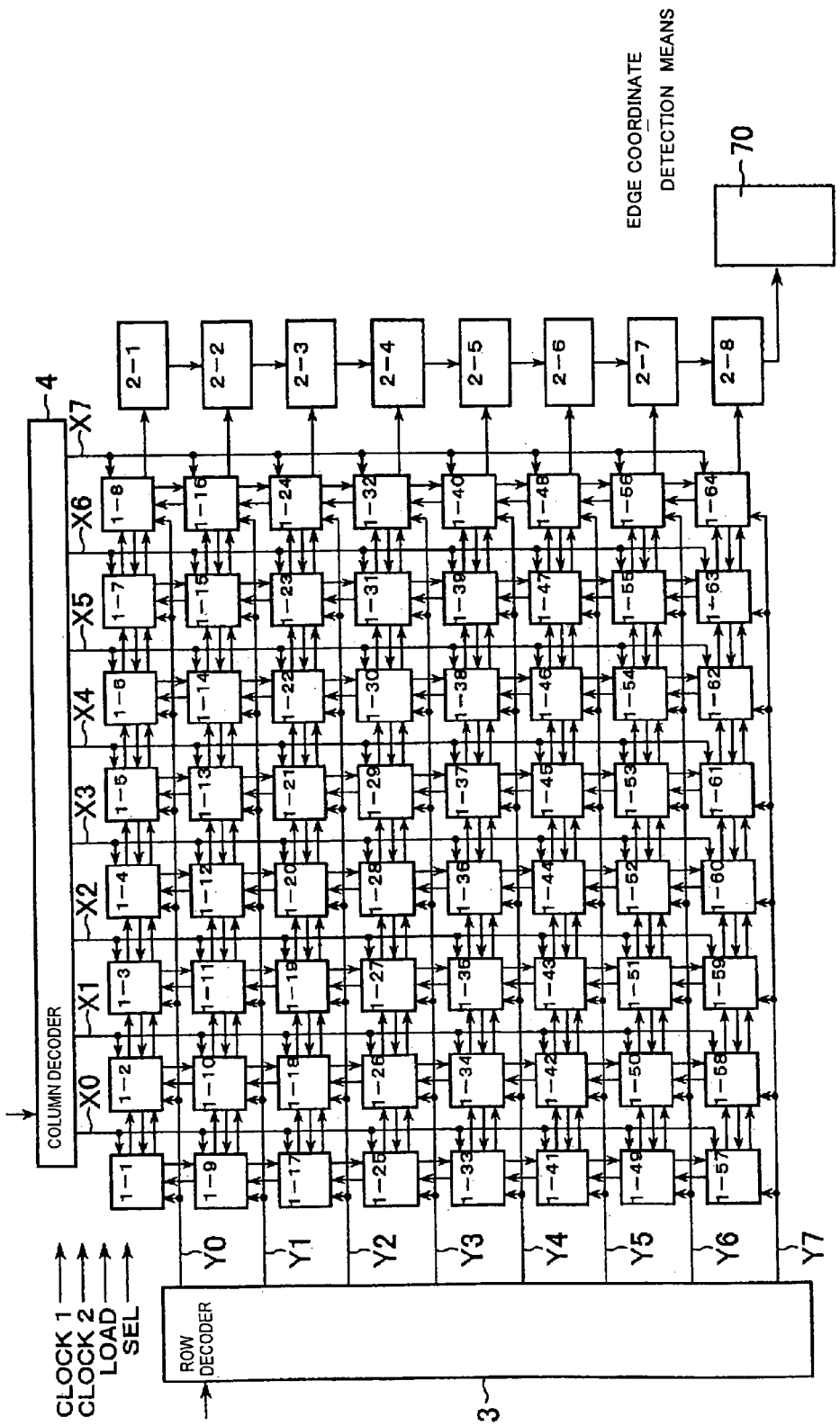
FIG. 1 is an explanatory view for explaining the construction of an image detection processor of the present invention.

The first embodiment of the present invention is explained in conjunction with attached drawings. FIG. 1 is a view showing one example of an image detection processor according to the present invention. This image detection processor can be used for extracting a binarized image of an object body from an inputted image in a visual sensor of a robot, a collision prevention sensor of an automobile, a safety device of a machine tool and other control devices. That is, the binarized image of the moving object body, that is, the object body such as a vehicle traveling forwardly, a hand or a leg of an operator or the like is extracted from a background and the detection of edge coordinate or edge position information is performed. Here, along with the detection of edge coordinate of the object body, it is also possible to prepare processed data necessary for calculating a 0-order moment and a first-order moment for specifying the position of center of gravity of the object body image. An external processing processor can perform the prevention of collision, the countermeasure for safety and other controls by obtaining the edge coordinate of the object body from the edge coordinate of the two binarized image of the detected object body.

In FIG. 1, reference numerals 1-1 to 1-64 indicate image detection processing elements. These image detection processing elements are arranged on a plane in the row (X) direction and in the column (Y) direction as the grid-like arrangement structure formed of 8×8 pieces of image detection processing elements and an image of the object body is focused on the image detection processing elements. In an actual use, an optical system is arranged in front of the image detection processing elements and an inputted image of the moving object body is focused on the image detection processing elements through the optical system. Here, it is sufficient that the respective image detection processing elements are arranged like the grid and the number of the image detection processing elements can be increased or decreased depending on a usage thereof. Each image detection processing element includes a photo detector and a converter which converts electric signals form the photo detector into the binarized digital signals.

Each image detection processing element outputs the digital signals (the detected target image signals) to four image detection processing elements which are arranged at upper and lower sides and at left and right sides of the image detection processing element respectively. For example, the image detection processing element 1-11 outputs the target image signals to the image detection processing elements 1-3, 1-10, 1-12, 1-19. Further, the image detection processing element generates a window image signal for extracting the image of the object body from a background based on the target image signals which the image detection processing element receives from four image detection processing elements which are arranged at upper and lower sides as well as at left and right sides of the image detection processing element, and the own target image signal.

Further, each one of the image detection processing elements includes a first adder therein. The first adder disposed in the inside of each image detection processing element is connected with the first adder disposed in the inside of the image detection processing element positioned at the right side of and close to each image detection processing element. For example, an output of the first adder of the image detection processing element 1-11 is inputted to the first adder of the image detection processing element 1-12. In this manner, the first adders in the respective image detection processing elements are sequentially connected for every row and constitute a cumulative adder as a whole.

To each image detection processing element, respective signals CLOCK1, CLOCK 2, LOAD, SEL are inputted as common signals. The signal CLOCK1 and the signal LOAD are signals which are served for setting an initial image. For example, the signal CLOCK1 is a clock signal having frequency of 20 MHz to 100 MHz. The signal CLOCK2 and the signal SEL are signals which are served for performing image operations. Here, the signal CLOCK2 is a clock signal having frequency of 1 MHz to 10 MHz.

Reference numerals 2-1 to 2-8 are second adders and are constituted of a series adder. Respective second adders 2-1 to 2-8 are arranged for respective rows of the image detection processing elements and receive outputs from the image detection processing elements of corresponding rows to a one-side input thereof. Further, outputs of the respective second adders are sequentially connected to respective another inputs of the second adders which are arranged close to each other and constitute a second cumulative adder circuit as a whole. In this embodiment, the second adder 2-1 corresponds to the image detection processing elements 1-1 to 1-8 and the output of the image detection processing element 1-8 is connected to the one-side input of the second adder 2-1. The output of the second adder 2-1 is connected to the another side input of the second adder 2-2. Further, the output of the second adder 2-8 becomes the whole output and constitutes an output part of the processed data based on the image data of the object body which is detected by the photo sensors. The constitution of respective second adders is explained later.

Reference numeral 3 indicates a row decoder circuit in which output signals Y0 to Y7 are controlled in response to four row selection signals. Reference numeral 4 indicates a column decoder circuit in which output signals X0 to X7 are controlled in response to four column selection signals. The row decoder circuit 3 and the column decoder circuit 4 constitute control circuits which allow the target image signals of the image detection processing elements to be inputted to the first cumulative adder.

In this embodiment, the selection of image detection processing elements for each row and the selection of image detection processing elements for each column among the plurality of image detection processing elements 1-1 to 1-64 arranged in the grid-like array are performed by the row decoder circuit 3 and the row decoder circuit 4. Then, the control of the row decoder circuit 3 and the column decoder circuit 4 is performed by an external host computer not shown in the drawing. For example, the external host computer sequentially selects all rows shown in FIG. 1 one after another from above to below using the row decoder circuit 3. At this point of time, all columns are held in a selected state using the column decoder circuit 4. Accordingly, all target image signals of the selected rows by the row decoder circuit 3 are inputted to the first cumulative adder and are outputted to any one of the second adders 2-1 to 2-8 which correspond to the row. As a result, the processed data based on the binarized data detected by the photo detectors of the image detection processing elements are outputted from the output part. The processed data are supplied to the edge coordinate detection means 70 which is connected to an output part of the second adder 2-8. When the edge coordinate detection means 70 inspects the supplied processed data and initially detects the presence of the target image signals, the row number of the row selected by the row decoder circuit 3 becomes the coordinates in the Y-axis direction of the edges in the object body image.

Next, with respect to the image detection processing elements of the detected row number, the row decoder circuit 3 and the column decoder circuit 4 are controlled so as to sequentially connect the target image signals from the image detection processing elements to the first cumulative adder from left to right in FIG. 1. Then, the target image signals are outputted to one of the second adders 2-1 to 2-8 which corresponds to the row. Accordingly, the processed data based on the binarized data which is detected by the photo detectors of the image detection processing elements of the row are outputted from the output part and are supplied to the edge coordinate detection means 70. The edge coordinate detection means 70 inspects the supplied processed data and detects the row number on which the presence of the target image signals are firstly detected among the rows, as the coordinates in the X-axis direction of the edge of the object body image. In this manner, the X-axis coordinates and the Y-axis coordinates of the edge of the object body image are detected. Here, the detail of the detection of the edge coordinate of the object body image is explained later.

Figure 2:
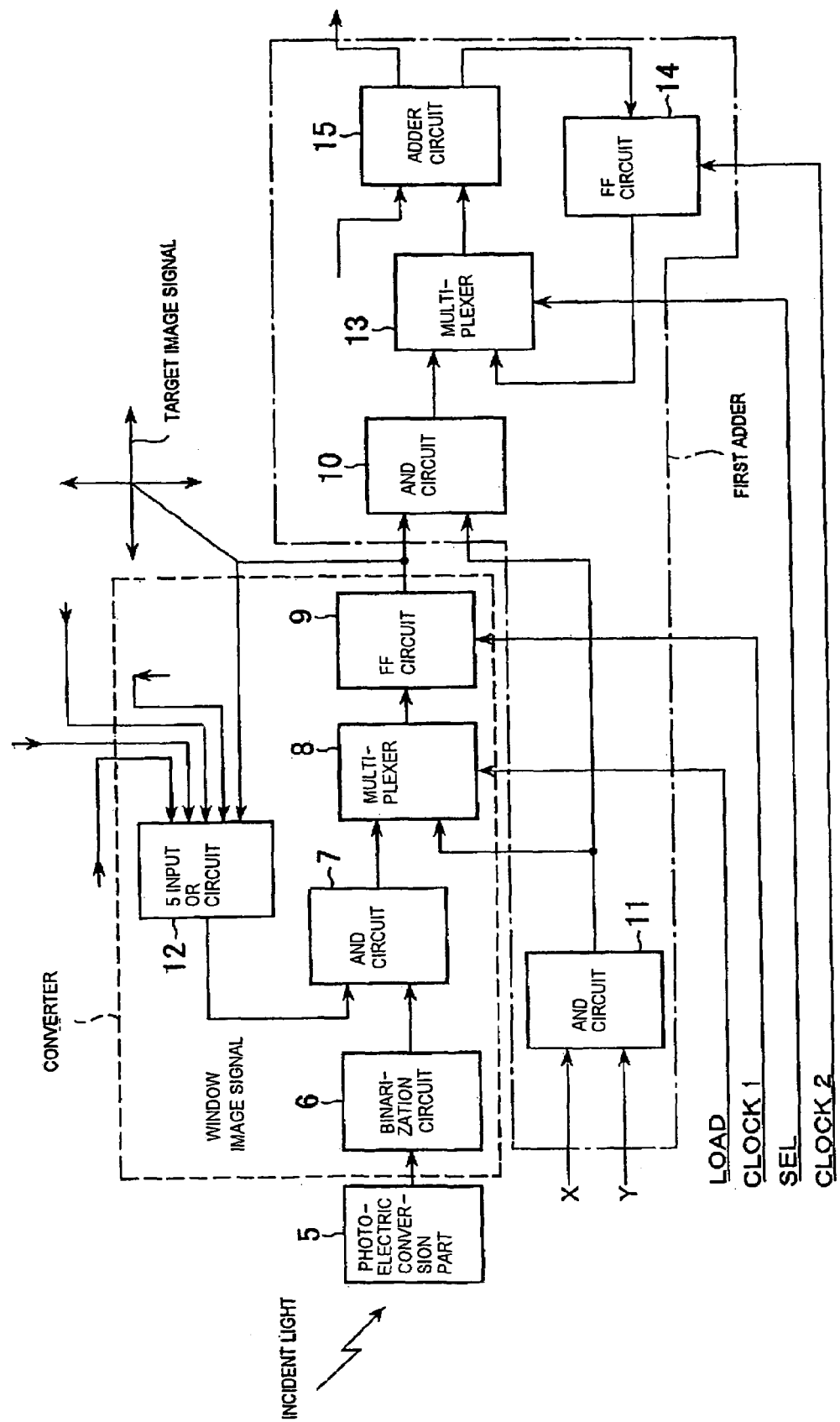
FIG. 2 is an explanatory view for explaining the construction of an image detection-processing element, which constitutes an essential part of the image detection processor of FIG. 1.

Next, the constitution of each image detection processing element is explained in conjunction with FIG. 2. Reference numeral 5 indicates a photoelectric conversion part which constitutes the photo detector and is constituted of a photo diode. The photo detector outputs a signal corresponding to a strength of light incident on the photo diode. Reference numeral 6 indicates a binarization circuit which is constituted of a comparator and binarizes the electric signal from the photoelectric conversion part 5. In this embodiment, corresponding to a quantity of light inputted to the photoelectric conversion part 5, when the quantity of light is brighter than a given threshold value, a signal "H" is outputted and when the quantity of light is darker than the given threshold value, a signal "L" is outputted. Although, in this embodiment, the binarized value data is outputted, the present invention is not limited to such a case and multiple value data having gray scales may be processed. In this case, as the first adder, a full adder is used. Reference numeral 7 indicates a conjunction (AND) circuit and outputs the signal "H" when both of the signal from the binarization circuit 6 and a signal from a 5-input disjunction (OR) circuit 12 described later are "H". Reference symbol 8 indicates a multiplexer which outputs the signal from the conjunction circuit 7 when the signal LOAD in FIG. 1 is "H" and outputs the signal from a logic circuit 11 when the signal LOAD in FIG. 1 is "L". Reference numeral 9 indicates a flip-flop circuit which outputs a signal to the multiplexer 8 by incorporating the signal in the clock signal CLOCK1 shown in FIG. 1. The converter is constituted of the binarization circuit 6, the conjunction circuit 7, the multiplexer 8, the flip-flop circuit 9 and the 5-input disjunction circuit 12.

Reference numeral 10 indicates a conjunction circuit. The conjunction circuit 10 outputs a signal "H" when both of an output of the flip-flop circuit 9 and an output of the conjunction circuit 11 described later are "H". The conjunction circuit 11 receives an output of the row decoder 3 and an output of the column decoder 4 as inputs, wherein when both of the output of two decoders are "H", the signal "H" is outputted. For example, in the image detection processing element 1-11, when the output Y1 of the row decoder 3 and the output X2 of the column decoder 4 are "H", the signal "H" is outputted. Reference numeral 12 is the 5-input disjunction circuit and receives an output of the own flip-flop circuit 9 and outputs of respective flip-flop circuits 9 of the image detection processing elements disposed closely at upper and lower sides as well as at left and right sides of the image detection processing element as inputs and outputs the disjunction therefrom. For example, in the image detection processing element 1-11, the outputs of the respective flip-flop circuits 9 in the inside of the image detection processing elements 1-3, 1-10, 1-12, 1-19 become inputs and when there exists one or more "H", the output of the 5-input disjunction circuit 12 becomes "H".

Reference numeral 13 indicates a multiplexer. The multiplexer 13 outputs the signal from the conjunction circuit 10 when the signal SEL shown in FIG. 1 is "H". Further, when the signal SEL is "L", the multiplexer 13 outputs the signal from the flip-flop circuit 14. The reference numeral 14 indicates a flip-flop circuit and fetches and outputs a CARRY signal of an adder 15 described later using the clock signal CLOCK2 shown in FIG. 1. Reference numeral 15 indicates the adder circuit formed of a half-adder circuit. The adder circuit 15 calculates an arithmetic sum of the output of the multiplexer 13 and a SUM signal of the adder circuit of the neighboring image detection processing element and outputs a SUM signal and a CARRY signal. For example, in the image detection processing element 1-11, when both of the output of the multiplexer 13 and the SUM signal of the adder circuit 15 in the image detection processing element 1-10 are "L", both of the SUM signal and the CARRY signal become "L". Further, when one of them is "L" and another is "H", the SUM signal becomes "H" and the CARRY signal becomes "L". Then, when both signals become "H", the SUM signal becomes "L" and the CARRY signal becomes "H".

The first adder is constituted of the conjunction circuits 10, 11, the multiplexer 13, the flip-flop 14 and the adder 15.

Figure 3:
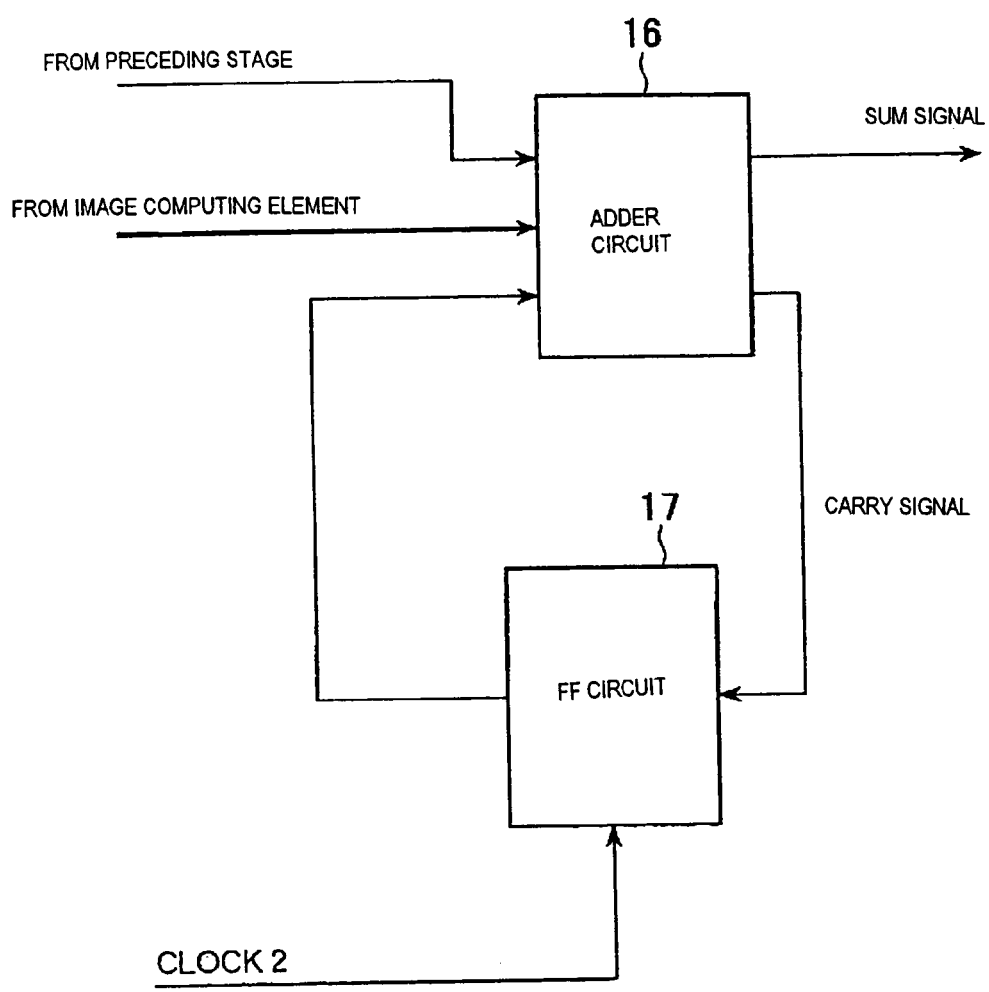
FIG. 3 is an explanatory view for explaining the construction of a series adder, which constitutes an essential part of the image detection processor of FIG. 1.

Next, the detail of the constitution of series adder is explained in conjunction with FIG. 3. Reference numeral 16 indicates an adder circuit which is formed of a full adder, performs the arithmetic adding operation of the SUM signal of the above-mentioned image detection processing element and the SUM signals of a flip-flop circuit 17 described later and the adder circuit 16 of a preceding stage, and outputs the SUM signal and the CARRY signal. For example, in case of the series adder 2-2, the series adder 2-2 receives three outputs, that is, the output of the image detection processing element 1-16, the output of the series adder 2-1 and the output of the flip-flop circuit 17 as inputs and outputs the SUM signal and the CARRY signal. The SUM signal becomes an input of the series adder circuit of the series adder 2-3 and the CARRY signal becomes an input of the flip-flop circuit 17. In the adder circuit 16, when all of three input states become "L", both of the SUM signal and the CARRY signal becomes "L". On the other hand, when one of these states becomes "H", the SUM signal becomes "H" and the CARRY signal becomes "L". Further, when the both signals become "H", the SUM signal becomes "L" and the CARRY signal becomes "H". Still further, when all signals become "H", both of the SUM signal and the CARRY signal becomes "H". Reference numeral 17 indicates a flip-flop circuit and fetches and outputs the CARRY signal of the adder circuit 16 in response to the above-mentioned clock signal CLOCK2.

Next, the overall operation of the image detection processor of this embodiment is explained. First of all, to perform the initialization of the inner circuit, all of the row decoders 3 and the column decoders 4 are set to a non-selective state in which the image detection processor is set such that an image selection signal is outputted from the multiplexer 13 in response to the signal SEL. When the clock signal CLOCK2 is inputted by 1 clock or more in this state, a latch circuit 14 in the inside of the image detection processing element is initialized. Further, when the clock signal CLOCK2 is inputted by 6 clocks or more while holding the state, the latch circuits 17 in the series adders are initialized in the same manner.

Next, setting of a window image signal is performed. The window image signal is provided for separating the image of the object body from the background. First of all, the image detection processor is set such that with the signal LOAD, the pixel selection signal is outputted from the multiplexer 8. Then, by setting the row decoders 3 and the column decoders 4, the initial setting of the window image is performed. When the row decoders 3 and the column decoders 4 are respectively set such that all outputs are selected, the initial value of the window image covers the whole screen.

Next, the fetching of the image is performed. First of all, using a proper focusing optical system, an image of the object body is focused on the image detection processing elements arranged on a plane. The focusing optical system may be a lens optical system such as a digital still camera or the like. In each image detection processing element, first of all, the photoelectric conversion part 5 converts the information on contrast of the object body into an analogue signal corresponding to a light quantity of the focused image. The analogue signal is converted into the binarized image signal having the value of "L" or "H" by the binarization circuit 6.

The binarized image signal is subjected to the conjunction operation with the above-mentioned window image signal in the conjunction circuit 7 and is converted into the target image signal. The target image signal is outputted to the flip-flop circuit 9 through the multiplexer 8 and is fetched at the timing of the clock signal CLOCK1. The target image signal which is fetched in the flip-flop circuit is inputted to the 5-input disjunction circuit 12 for generating the window signal at the timing of the next clock signal CLOCK1.

The output of the flip-flop circuit 9 is inputted to 5-input disjunction circuit 12 in the inside of the same image detection processing element and, at the same time, is also outputted to 5-input disjunction circuits 12 in the inside of the neighboring four image detection processing elements. Then, the window image signal is outputted from the 5-input disjunction circuits 12.

This state is shown in FIGS. 4A and 4B. FIG. 4A is the binarized image which becomes an original image for generating the window image, wherein respective cells correspond to the image detection processing elements 1-1 to 1-64 shown in FIG. 1. FIG. 4B is the window image generated from the original image shown in FIG. 4A. Then, in the inside of each image detection processing element, the outputs of four flip-flop circuits 9 of the image detection processing elements at the upper and lower sides and at the left and right sides of image detection processing element are also inputted and hence, the window image spreads in the upward and downward directions as well as in the left and right directions with respect to the original image. An image which is obtained by performing the arithmetic operation between the window image shown in FIG. 4B and the image signal which is converted in the next frame, that is, the binarized image in the state of FIG. 4A in the next frame becomes the target image. That is, for each frame, along with the movement of the target image signal, the window image is formed with a slight extension. Then, the image included therein is obtained as a new target signal. When an interval between the frame and the next frame is sufficiently short, the moving distance of the target is sufficiently short and hence, even when the circuit of this embodiment is used, the target tracking operation can be realized.

Next, the image arithmetic operation for calculating the total number of pixels, that is, the area (0-order moment) of the target (object body) image is explained. First of all, the operations of portions including and succeeding the conjunction circuit 10 and the portions of the series adders in the inside of the respective image detection processing element are collectively explained as the 64-input-adder array. The target image signal outputted from the flip-flop circuit 9 is inputted to the multiplexer 13 only when the pixel selection signal is "H" in the conjunction circuit 10. Here, the explanation is made with respect to the case in which all image detection processing elements 1-1 to 1-64 are selected.

Figure 5:
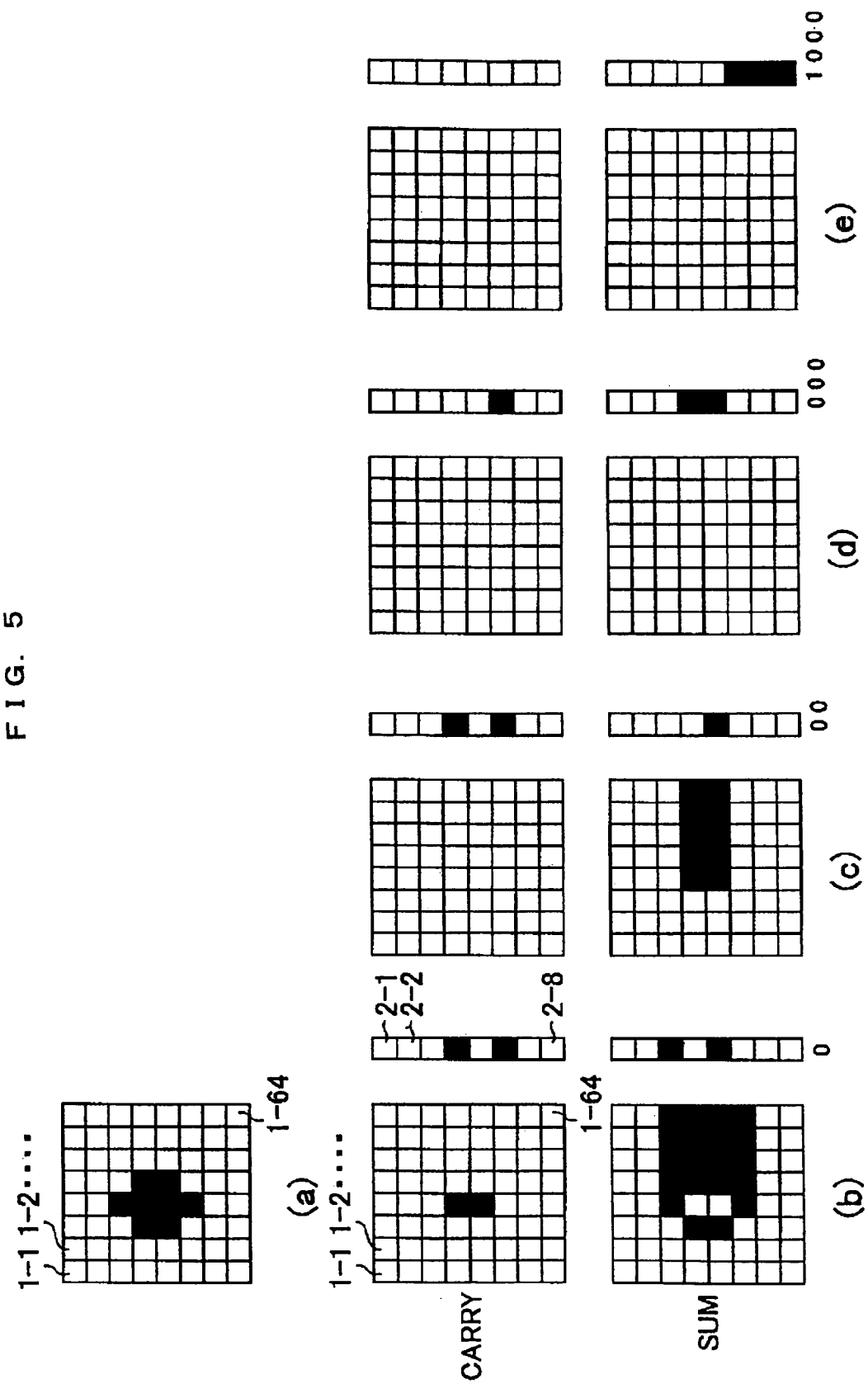
FIGS. 5A to 5E are explanatory views for explaining the operation of the image detection processor of FIG. 1.

FIG. 5A shows a state of the target image. Here, the total number of pixels of "H" (displayed in black) is set to 8. First of all, the signal SEL is set to "H" so that the output of the conjunction circuit 10 is selected by the multiplexer 13. Accordingly, to the adders (the half-adders) 15 of the respective image detection processing elements, the signal of "H" or "L" (displayed in white) corresponding to the image of the target is inputted.

In FIGS. 5A to 5E, the states of the adders in the respective image detection processing elements corresponding to the image of the target shown in FIG. 5A and the series adders are shown in FIG. 5B. In FIG. 5B, CARRY and SUM indicate the CARRY signal and the SUM signal in the respective adders. The output of the conjunction circuit 10 which is inputted to the image detection processing element 1-20 assumes "H" and the SUM signal "H" of the adder circuit 15 is sequentially outputted to the image detection processing element 1-21 to the image detection processing element 1-24 at the succeeding stage. Accordingly, all of the SUM signals of these adder circuits 15 are set to "H".

In the series adder 2-3 which receives the signal "H", the SUM signal "H" from the image detection processing element 1-24 and the SUM signal "L" from the adder circuit 16 in the inside of the series adder 2-3 are added to output the SUM signal "H" and the CARRY signal "L". Further, all of the outputs of the conjunction circuits 10 of all image detection processing elements 1-27, 1-28, 1-29 are set to "H". Accordingly, in the adder circuit 15 of the image detection processing element 1-28, the output "H" of the conjunction circuit 10 and the SUM signal "H" of the image detection processing element 1-27 of the preceding stage are added to generate SUM signal "L" and the CARRY signal "H". Then, in response to the SUM signal "H" outputted from the adder circuit 15 of the image detection processing element 1-29, "H" is sequentially outputted to the image detection processing element 1-30 to 1-32 of succeeding stage, and all of the SUM signals in these adder circuits 15 become "H".

In the series adder 2-4 which receives these signals, by adding the SUM signal "H" from the image detection processing element 1-32 and the SUM signal "H" of the adder circuit 16 in the inside of the series adder 2-3 of the preceding stage, the SUM signal "L" and the CARRY signal "H" are outputted.

Further, all of the outputs of the conjunction circuits 10 of the image detection processing elements 1-35, 1-36, 1-37 become "H". Accordingly, in the adder circuit 15 of the image detection processing element 1-36, the output "H" of the conjunction circuit 10 and the SUM signal "H" of the image detection processing element 1-35 of the preceding stage are added so that the SUM signal assumes "L" and the CARRY signal assumes "H". Then, due to the SUM signal "H" outputted from the adder circuit 15 of the image detection processing element 1-37, "H" is sequentially outputted from the image detection processing element 1-38 to the image detection processing element 1-40 of the succeeding stage and all of the SUM signals of the adder circuits 15 assume "H".

In the series adder 2-5 which receives these signals, by adding the SUM signal "H" from the image detection processing element 1-40 and the SUM signal "L" of the adder circuit 16 in the inside of the series adder 2-4 of the preceding stage, the SUM signal "H" and the CARRY signal "L" are outputted.

Further, in the adder circuit 15 in the inside of the image signal processing element 1-44, the output "H" of the conjunction circuit 10 and the SUM signal "L" of the image detection processing element 1-43 of preceding stage so as to output the SUM signal "H" and the CARRY signal "H".

In the same manner, the SUM signal "H" of the adder circuit 15 of the image detection processing element 1-44 is sequentially outputted from the image detection processing element 1-45 to the image detection processing element 1-48 of the succeeding stage. In the series adder 2-6 which receives these signals, by adding the SUM signal "H" from the image detection processing element 1-48 and the SUM signal "H" of the adder circuit 16 of the series adder 2-5 of the preceding stage, the SUM signal "L" and the CARRY signal "H" are outputted. The SUM signal "L" of the adder circuit 16 of the series adder 2-6 is sequentially outputted to the series adders 2-7, 2-8 of succeeding stage. Here, from the series adder 2-8, the value of the lowermost digit when the total number of the pixels which constitute the target image is expressed by binary number is outputted. To the target image shown in FIG. 5A, the signal of "L" level which corresponds to "0" is outputted.

In this state, when the clock signal CLOCK2 is inputted, the CARRY signal is fetched to the flip-flop circuit 14. By setting the signal SEL to "L", into the adder circuit (the half-adder) 15, the CARRY signal which is stored in the flip-flop circuit 14 is inputted in place of the outputting of the conjunction circuit 10. In this case, the states of the respective image detection processing elements and the series adder are shown in FIG. 5C. In the image detection processing elements 1-28, 1-36, the CARRY signal which is stored in the flip-flop circuit 14 is "H" and hence, as shown in FIG. 5B, the adder circuits 15 of the image detection processing elements 1-29 to 1-32, 1-37 to 1-40 output the SUM signal "H" and the CARRY signal "L".

The adder circuit 16 of the series adder 2-4 adds the SUM signal "L" of the series adder 2-3 of the preceding stage, the SUM signal "H" from the image detection processing element 1-32 and the CARRY signal "H" stored in the flip-flop circuit 17. As a result, the SUM signal "L" and the CARRY signal "H" are outputted. The adder circuit 16 of the series adder 2-5 adds the SUM signal "L" of the series adder 2-4 of the preceding stage, the SUM signal "H" from the image detection processing element 1-40 and the CARRY signal "L" stored in the flip-flop circuit 17. As a result, the SUM signal "H" and the CARRY signal "L" are outputted. The adder circuit 16 of the series adder 2-6 adds the SUM signal "H" of the series adder 2-5 of the preceding stage, the SUM signal "L" from the image detection processing element 1-48 and the CARRY signal "H" stored in the flip-flop circuit 17. As a result, the SUM signal "L"and the CARRY signal "H" are outputted. In the adder circuits 16 of the series adders 2-7, 2-8, the SUM signal "L" and the CARRY signal "L" are outputted. Here, from the series adder 2-8, the value of (the lowermost+1) digit when the total number of the pixels which constitute the target (object body) image is expressed by binary number is outputted. To the target image shown in FIG. 5A, the signal of "L" level which corresponds to "0" is outputted.

Further, operations similar to the above-mentioned operations are repeated and, each time the clock signal CLOCK2 is inputted, the states of the respective image detection processing elements and the series adders sequentially become as shown in FIG. 5D and FIG. 5E. In the state shown in FIG. 5E in which the clock signals CLOCK2 are inputted by 3 clocks, from the series adder 2-8, the value of (the lowermost+3) digit when the total number of the pixels which constitute the target (object body) image is expressed by binary number is outputted. Then, a signal of "H" level which corresponds to 1 is outputted. As a result, the value obtained from the series adder 2-8 after inputting the SEL signal "H" becomes "100" and the value corresponding to 8 which is the total number of the pixels which constitute the target image shown in FIG. 5A is obtained by the binary number. Thereafter, since the CARRY signal of "H" level is not stored in any one of the flip-flop circuits, even when the clock signal CLOCK2 is inputted, the "L" is outputted from the series adder 2-8.

As described above, each time the clock signal CLOCK2 is inputted the total number of the pixel which constitutes the target image is sequentially outputted from the lower digit using the binarized values. In this embodiment, by inputting the clock signal CLOCK2 by 7 clocks after inputting the SEL signal, the total number of the pixels which constitute the target image shown in FIG. 5A can be expressed by the binarized value of 7 digits. In this manner, with the least number of clocks (7 clocks), it is possible to obtain the total number of pixels which constitute the target image, that is, the area (O-order moment) of the target image.

Figure 6:
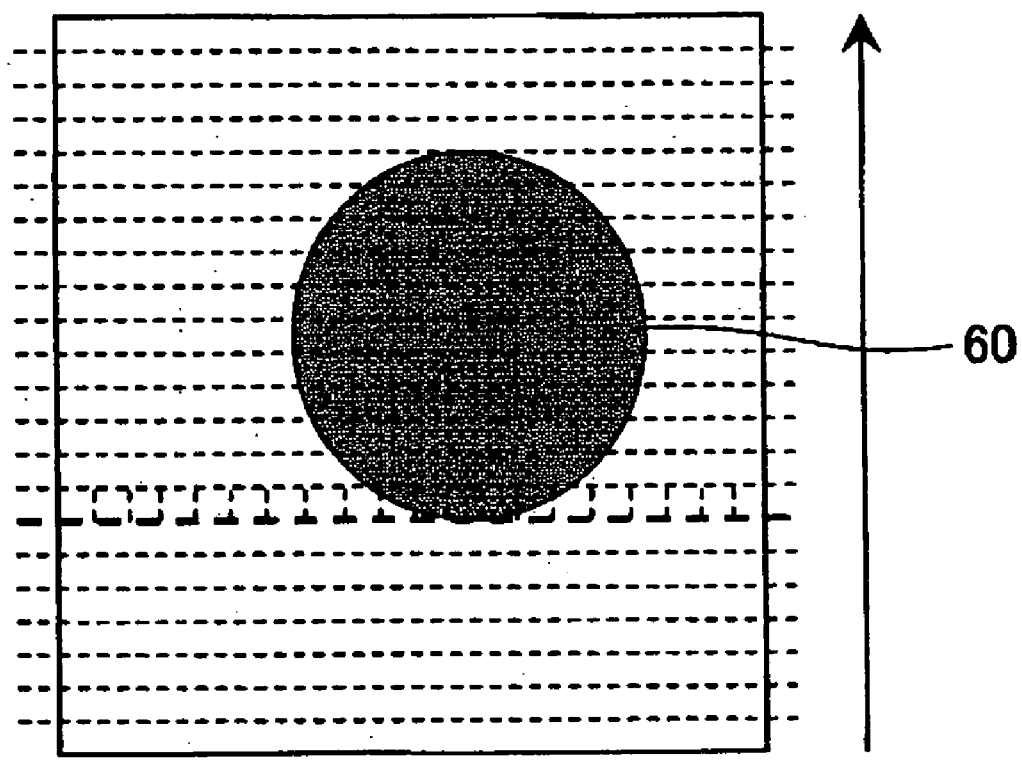
FIG. 6 is an explanatory view for explaining the operation of the image detection processor of FIG. 1.

Next, the explanation is made with respect to the operation to detect and trace the edge coordinate of the target (object body) image 60 shown in FIG. 6 using the above-mentioned image detection processor. As mentioned previously, the respective rows of the image detection processing elements arranged like a grid are scanned by the row decoder circuit 3 and the column decoder circuit 4 shown in FIG 1 and the binarized signals indicative of the area of the target (object body) image 60 is detected by the edge coordinate detection means 70 (see FIG. 1). The scanning of the image detection processing elements is, for example, sequentially performed from the lowermost row to the uppermost row (or from the uppermost row to the lowermost row). The row number of the position where the binarized signal value "H" indicative of the area of the target (object body) image 60 is initially detected due to the sequential scanning constitutes the Y-axis (longitudinal axis) coordinate value of the edge of the target (object body) image 60. Here, alternatively, it is possible to use a dichotomizing search method in which the whole screen is divided into upper and lower halves and the edge of the target image 60 is obtained. With the use of the dichotomizing search method, it is possible to perform the edge detection processing also on the image of high resolution in a short period.

Next, the row of the image detection processing element in which the position where the binarized signal value ("H") indicative of the area of the target (object body) image 60 is initially detected is present is scanned and, thereafter, the binarized signal indicative of the area of the target (object body) image 60 is detected using the edge coordinate detection means 70 (see FIG. 1). This scanning is sequentially performed from the leftmost row to the rightmost row using the row decoder circuit 3 and the column decoder circuit 4. The column number of the position where the binarized signal value "H" indicative of the area of the target (object body) image 60 is initially detected due to the scanning of the specific row constitutes the X-axis (lateral axis) coordinate value of the edge of the target (object body) image 60. Here, alternatively, it is possible to use a dichotomizing search method in which the whole screen is divided into upper and lower halves and the edge of the target image 60 is obtained.

Figure 7:
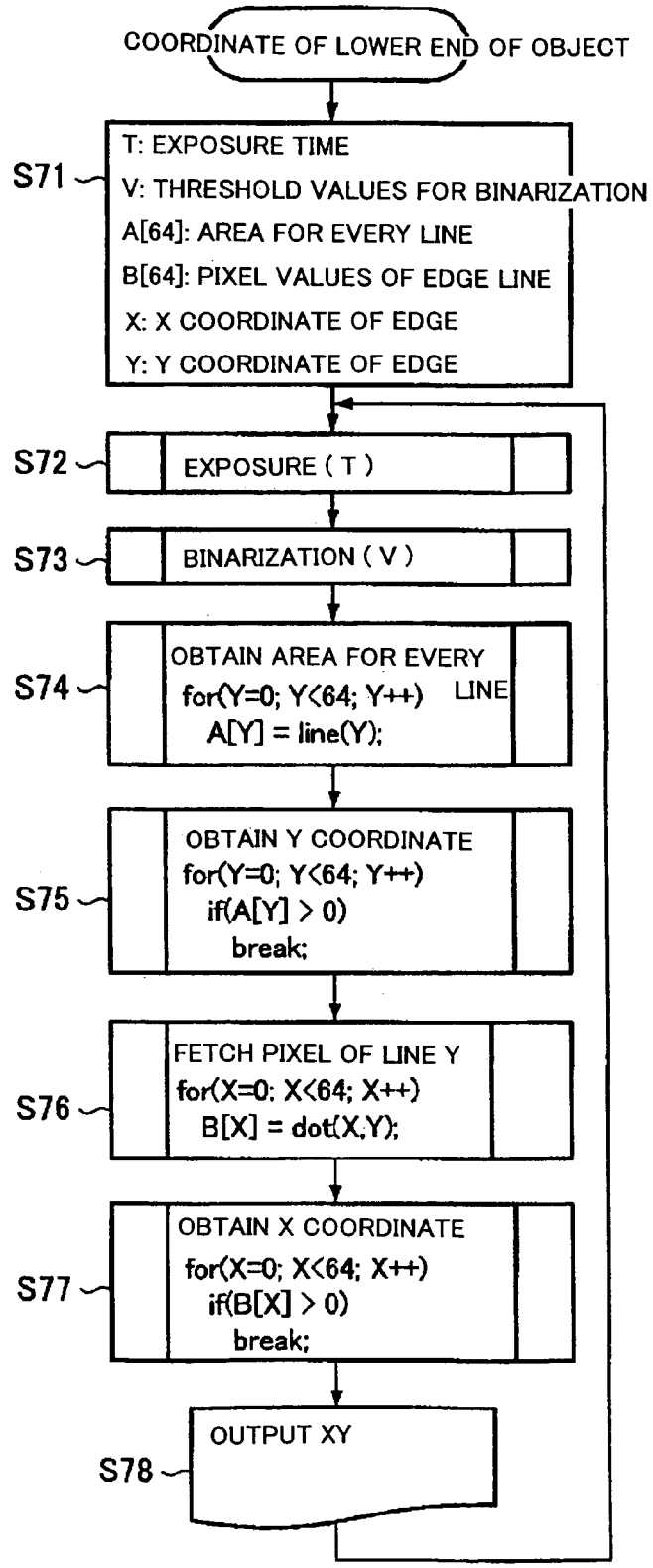
FIG. 7 is a flowchart of a method for detecting an edge coordinate of a target using the image detection processor of the present invention.

Next, the detail of the operation to detect and trace the edge coordinate of the target (object body) image 60 is explained in conjunction with a flow chart shown in FIG. 7. In the image detection processor of the embodiment shown in FIG. 7, 64×64 pieces of image detection processing elements are arranged like a grid.

First of all, the image detection processor is initialized (step 71), wherein the exposure time T and the threshold value V for binarization are set to given values. Then, an area A [64] for every 0 row to 63 row, the pixel value B [64] of 0 column to 63 column [64] of each row, and the X coordinate value and the Y coordinate value at the edge of the target (object body image) are reset to zero. Next, using a proper optical system, the target (object body) image 60 is focused on the 64×64 pieces of image detection processing elements (step 72) for the exposure time (T). Next, using the threshold value V, the target (object body) image 60 is binarized and the image is extracted from the background (step 73). Then, the area A [Y] of the target (object body) 60 for every 0th row to 63th row are sequentially measured starting from the 0th row using the binarized signals (step 74). As mentioned previously, in the image processor of the present invention, it is possible to obtain the area of the binarized image of the target (object body) image at a high speed. If the area A [Y] of the target (object body) image 60 for every 0th row to 63th row firstly reaches the row (row number: Y) which is greater than zero, the row number Y is stored as the Y coordinates (step 75). Then, the pixel value B[X] of 0th row to 63th row of the row (row number Y) is sequentially measured from the 0th row (step 76). If the pixel value B [X] reaches the row (column number: X) which is greater than zero, the column number X is stored as the X coordinates (step 77).

Figure 8:
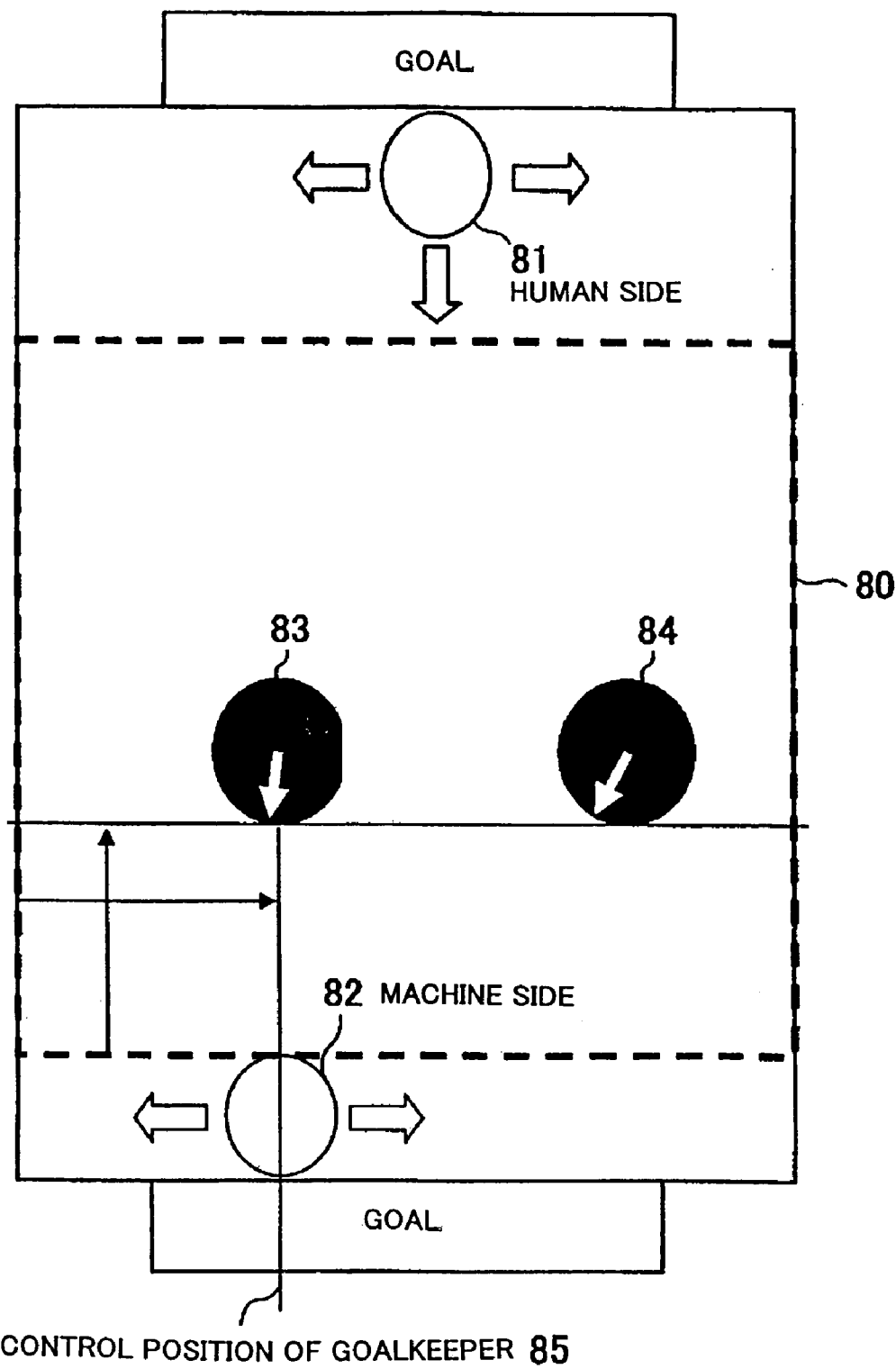
FIG. 8 is an explanatory view explaining a method for detecting an edge coordinate of a target using the image detection processor of the present invention.

The X coordinate value and the Y coordinate value of the edge coordinate of the target (object body) image 60 obtained in such a manner are outputted (step 78) and, thereafter, the processing returns to the exposure cycle. In this manner, the locus of the edge coordinate of the target (object body) 60 can be obtained. FIG. 8 shows an application example of the method for detecting and tracing the distal coordinates of the target (object body) image. This embodiment is directed to a hockey game which uses a plurality of pucks 83, 84. An upper goal indicates a goal keeper 81 which is a human player. A lower goal is a goal keeper 82 which is formed of a mechanical player using the method for detecting and tracing the edge coordinate of the target (object body) image of the embodiment. The goal keeper 82 which is the mechanical player processes an input image of a field 80 including pucks 83, 84 in accordance with the embodiment shown in FIG. 7. A locus of the left end (or the right end) of the edge of the pack arranged at the frontmost position is obtained by the processing and the position 85 of the goal keeper 82 is controlled. If two pucks 83, 84 are aligned in the lateral direction, the locus of edge of one pack is obtained so as to control the position 85 of the goal keeper 82.

Figure 9:
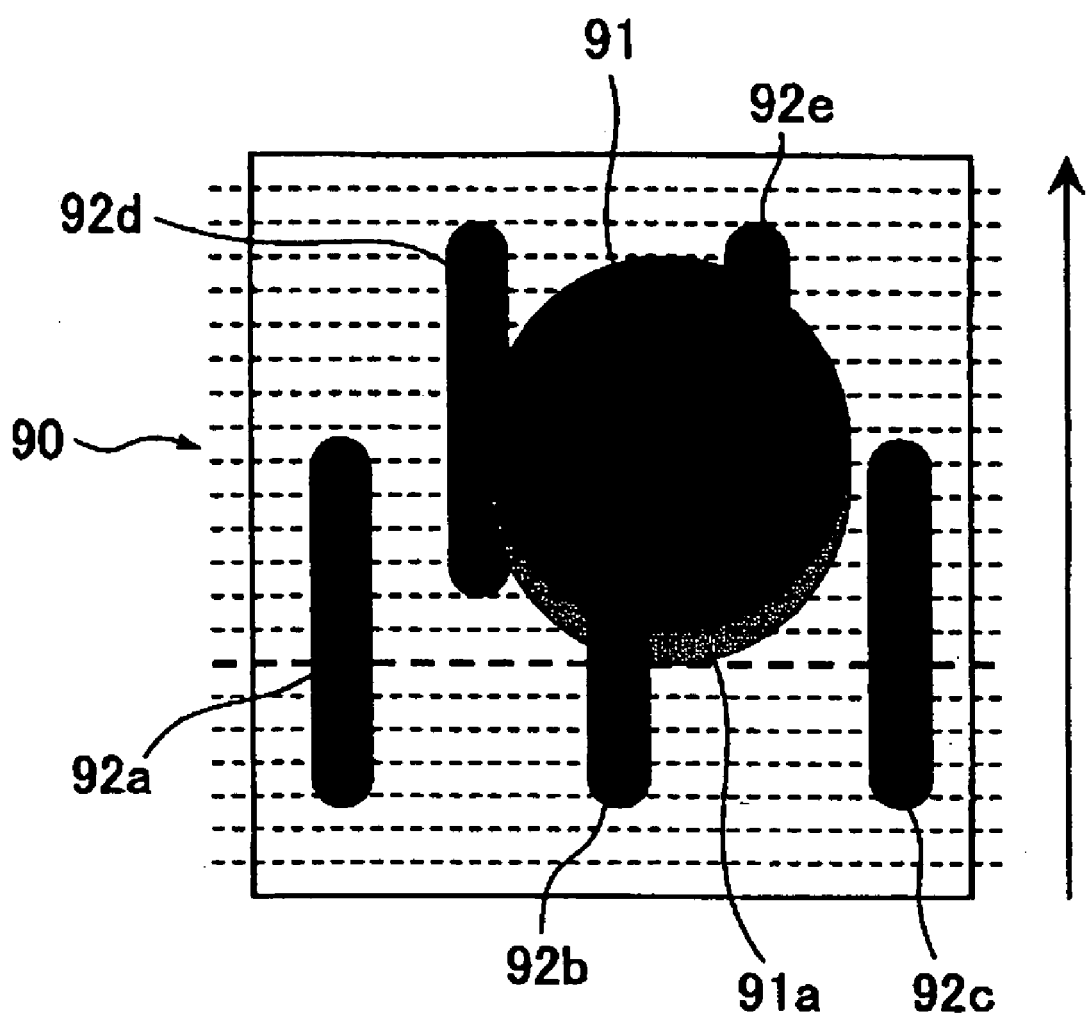
FIG. 9 is an explanatory view explaining a method for detecting an edge coordinate of a target using the image detection processor of the present invention.
Figure 10:
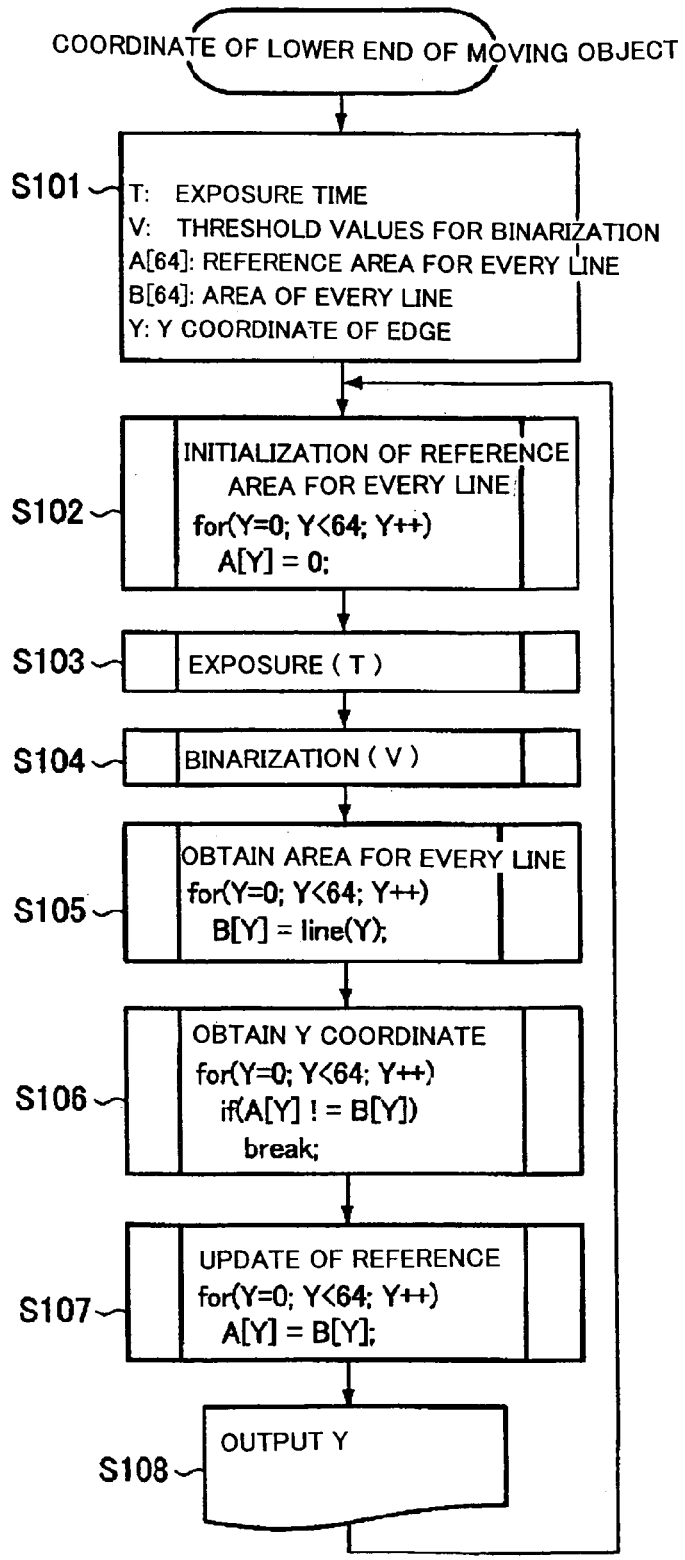
FIG. 10 is a flowchart of a method for detecting an edge coordinate of a target using the image detection processor of the present invention.

Next, another embodiment of the present invention is explained in conjunction with FIG. 9 and FIG. 10. In this embodiment, as shown in FIG. 9, in an inputted screen 90, a binarized image 91 of a moving target (object body) and still background images 92a to 92e which are also binarized images in the same manner are present. In this case, using a method described in a flow chart shown in FIG. 10, edge coordinate of the binarized image 91 of the target (object body) is detected. In the edge coordinate detection method shown in FIG. 10, to eliminate the influence of the still background images 92a to 92e, a difference 91a between the image detection of the previous time and the image detection of this time is determined and a portion where the difference 91a is generated is detected as a edge of the binarized image 91 of the moving target (object body).

Next, an operation to detect and trace a Y coordinate value of the edge 91a of the target (object body) image 91 is explained in conjunction with the flow chart shown in FIG. 10. Also in the image detection processor of this embodiment shown in FIG. 10, 64×64 image detection processing elements are arranged like a grid. First of all, by performing the initialization (step 101), an exposure time T and a binarized value threshold value V are set to given values, and the reference area A[64] of every one of rows 0th row to 63th row, the present area B [64] of every row and the X coordinate value and the Y coordinates of the lower end (edge) of the target (object body) 91 are reset. Next, using a suitable optical system, the inputted image 90 which includes the target (object body) image 91 and the still background images 92a to 92e are focused on the 64×64 image detection processing elements and an initial value of the reference area A [Y] for every one of rows 0 to 63 is obtained (step 102). Next, the exposure is performed only during the exposure time T and the inputted images 90 which include the target (object body) image 91 and the still background images 92a to 92e are obtained (step 103). By the previously-mentioned method, using the threshold value V, the input images 90 which include the target (object body) image 91 and the still background images 92a to 92e are binarized (step 104). The area B[Y] for every one of 0 to 63 rows of the binarized image due to the present exposure is obtained sequentially from the 0th row (step 105). In this manner, the image detection processor of the present invention can obtain the area of the binarized image of the input image at a high speed. Next, the area B[Y] for every one of 0 to 63 rows and the reference area A [Y] for every one of 0 to 63 rows of the binarized image due to the present exposure are sequentially compared. Then, when the area B[Y] for every one of 0 to 63 rows of the present binarized image differs from the reference area A[Y] of the row, the row number Y of the row is stored as the Y coordinates (step 106). Accordingly, the area B[Y] for every one of 0 to 63 rows of the binarized images due to the current exposure is replaced with the reference area A[Y] for every one of 0 to 63 rows (step 107). The Y coordinate value of the edge 91*a* of the target (object body) image 91 obtained in this manner is outputted (step 108). Then, the processing returns to the next exposure cycle. In this manner, the Y coordinate value of the edge 91*a* of the target (object body) image 91 is obtained.

In the above-mentioned explanation, the area of the image binarized is obtained for every unit row so as to detect the presence or the non-presence of the change of area for unit row at an interval of a given time. However, the detection of the presence or the non-presence of the change of area is not limited to the unit row. That is, it is possible to obtain the area of the image binarized for unit column so as to detect the presence or the non-presence of the change of area in a column unit.

Next, another embodiment of the present invention is explained. The image detection processor of this embodiment also has the schematic constitution substantially equal to the constitution of the image detection processor shown in FIG. 1. Further, the constitutions of the first adder or the series adders 2-1 to 2-8 in each pixel detection processing element are substantially equal to the constitutions shown in FIG. 2 and FIG. 3. Accordingly, with respect to these constitutions, FIG. 1 to FIG. 3 and the explanation of these drawings are referred to and the explanation of the constitutions is omitted in this embodiment. In the image detection processor of this embodiment, the constitution of the converters of respective image detection processing elements differs from the image detection processing elements of the previously described embodiment. Although the constitution of each image detection processing element is explained later in conjunction with FIG. 11 and FIG. 12, the image detection processing element includes a photo detector and a converter which converts an electric signal from the photo detector into binarized signals of "0" and "1" based on a specific threshold value so as to enable the processing of extracting an image of an object body having the intermediate brightness which moves in the background having a contrast from the background.

Figure 11:
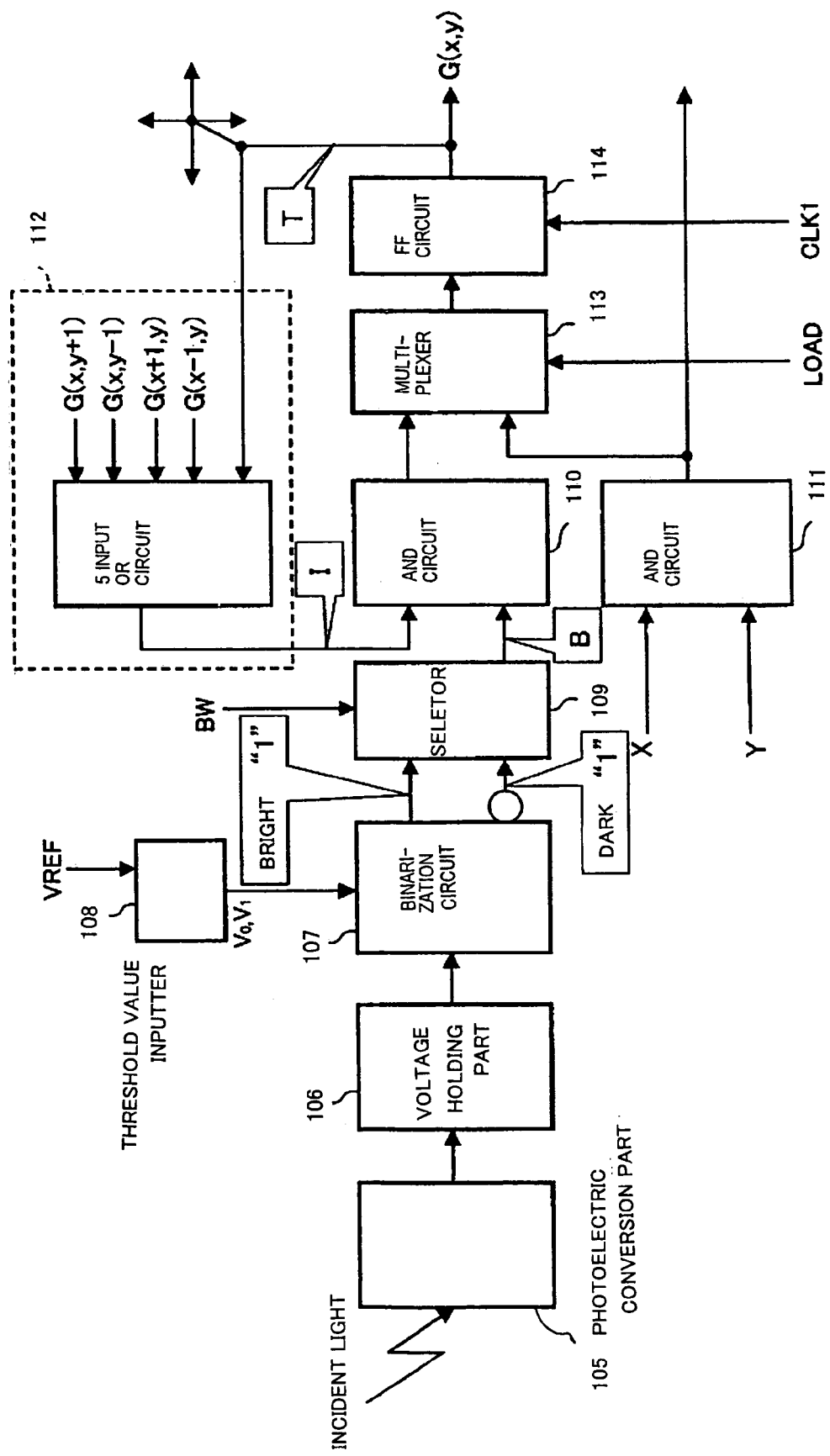
FIG. 11 is an explanatory view for explaining the construction of an image detection-processing element, which constitutes an essential part of the image detection processor related to other embodiment of the present invention.

Next, the constitution of each image detection processing element of this embodiment is explained in conjunction with FIG. 11. Reference numeral 105 indicates a photoelectric conversion part which constitutes a photo detector and outputs a signal corresponding to a strength of an incident light. Reference numeral 106 indicates a voltage holding part and holds a voltage of an electric signal output from the photoelectric conversion part 105. A binarization conversion circuit 107 is a circuit which is constituted of a comparator and binarizes the electric signal, wherein the electric signal output from the photoelectric conversion part 105 is inputted to the binarization conversion circuit 107 via the voltage holding part 106 and is converted into either value of "0" or "1". In this embodiment, the electric signal output is compared with two threshold values, that is, the large threshold value V1 and the small threshold value V0, wherein when the electric signal output is brighter than the threshold value, the signal "1" is outputted and when the electric signal output is darker than the threshold value, the signal "0 is outputted.

Among two threshold values, the small threshold value V0 corresponds to the dark light quantity and the large threshold value V1 corresponds to the bright light quantity. The data which are binarized using these two threshold values V0, V1 are respectively outputted to a selector 109 from the binarization conversion circuit 107. Here, the binarization conversion circuit 107 outputs the data which is converted using the threshold value V1 in a mode that "0" and "1" are inverted. The selector 109 selects one of binarized data inputted thereto from the conversion circuit 107 in response to the value of the control signal BW and outputs as an output signal B.

Here, the threshold values V0 and V1 in the binarization conversion circuit 107 can be arbitrarily set in response to an external signal VREF in conformity with the brightness of the object body and the background. In response to the external signal VREF, a threshold input device 108 sets either one of V0 or V1 to the binarization conversion circuit 17.

Reference numeral 110 indicates a conjunction (AND) circuit which outputs a signal of "1" only when both of the binarized signal B from the selector 109 and the signal 1 from a 5-input disjunction (OR) circuit 112 are "1". In other conditions, the conjunction (AND) circuit 110 outputs "0". The conjunction (AND) circuit 110 and the 5-input disjunction (OR) circuit 112 constitute an arithmetic operation means which performs the first operation processing and the second operation processing in response to a clock cycle of a CLOCK1. Reference numeral 113 indicates a multiplexer which outputs a signal from the conjunction circuit 110 when a signal LOAD is "H" (or "1") and outputs a signal from another conjunction circuit 111 when the signal LOAD is "L" (or "0"). Reference numeral 114 indicates a flip-flop circuit which fetches and outputs a signal of the multiplexer 113 in response to the clock signal CLOCK1.

An output of the flip-flop circuit 114 is outputted to a 5-input disjunction circuit 112 disposed in the inside of the same image detection processing element and, at the same time, is also outputted to 5-input disjunction circuits 112 disposed in the inside of the four image detection processing elements which are arranged at left and right sides and at upper side and lower sides of the image detection processing element. Then, a window image signal is outputted from the 5-input disjunction circuit 112.

FIG. 12 shows the further detailed constitution of the 5-input disjunction circuit 112. Reference numeral 112*a* indicates a 5-input disjunction circuit body and generates a binarized image which becomes an original to generate the window image. To the 5-input disjunction circuit body 112*a*, G(x, y+1), G(x, y−1), G(x+1, y), G(x−1, y) of the flip-flop circuits 114 in the inside of four image detection processing element arranged at the left and right sides as well as at the upper and lower sides of the image detection processing element and an output G(x, y) of the own flip-flop circuit are inputted. For example, in reference with FIG. 1, in the image detection processing element 1-11, the outputs of the respective flip-flop circuits 114 in the inside of the image detection processing elements 1-3, 1-10, 1-12, 1-19 and the output of the own flip-flop circuit 114 of the image detection processing element 1-11 become inputs of the 5-input disjunction circuit body 112*a*. Then, when one or more inputs among these inputs are "1", the output of the 5-input disjunction circuit body 112*a* becomes "1". Reference numeral 112*b* indicates a selector to which an output of the 5-input disjunction circuit body 112*a* and an output of the own flip-flop circuit 114 are inputted. Then, corresponding to the value of the control signal INF, one of these two inputs is selected and outputted. That is, the control signal INF selects either the expansion of the window image by one pixel or the holding of the present state as it is. By repeating the generation of the window image repeatedly, the window image can be expanded by one pixel for each repetition and hence, when the movement of the object body is fast, it is possible to catch the object in the inside of the window by expanding the window image.

That is, in response to the value of the control signal INF, the window image which constitutes a comparative object signal is generated. The disjunction signal of the 5-input disjunction circuit 112 obtained by the immediately-before arithmetic operation result is inputted to the conjunction circuit 110. Then, in the conjunction circuit 110, the conjunction (AND) operation of the disjunction signal and the data which is binarized by one (for example, 0V) of two threshold values selected by the selector 9 in response to the value of the control signal BW is performed. The result of the conjunction operation is inputted to the flip-flop circuit 114 via the multiplexer 113 in response to the clock signal CLOCK1. Next, the value of the control signal INL of the 5-input disjunction circuit 112 is changed and only the output held by the own flip-flop circuit 114 of the image detection processing element is selectively outputted by the selector 112b from the 5-input disjunction circuit 112 in response to the immediately-before CLOCK1 and is inputted to the conjunction circuit 110. Then, the value of the control signal BW of the selector 109 is changed and the data which is binarized by the threshold value (V1) different from the previous threshold value is inputted to the conjunction circuit 110 from the selector 109 and is subjected to the conjunction (AND) operation. The result of the conjunction operation is inputted to the flip-flop circuit 114 via the multiplexer 113 in response to the clock signal CLOCK1. In this manner, the conjunction circuit 10 performs the first arithmetic processing and the second arithmetic processing together with the 5-input disjunction circuit 112 in accordance with the clock cycle of the CLOCK1.

Figure 13:
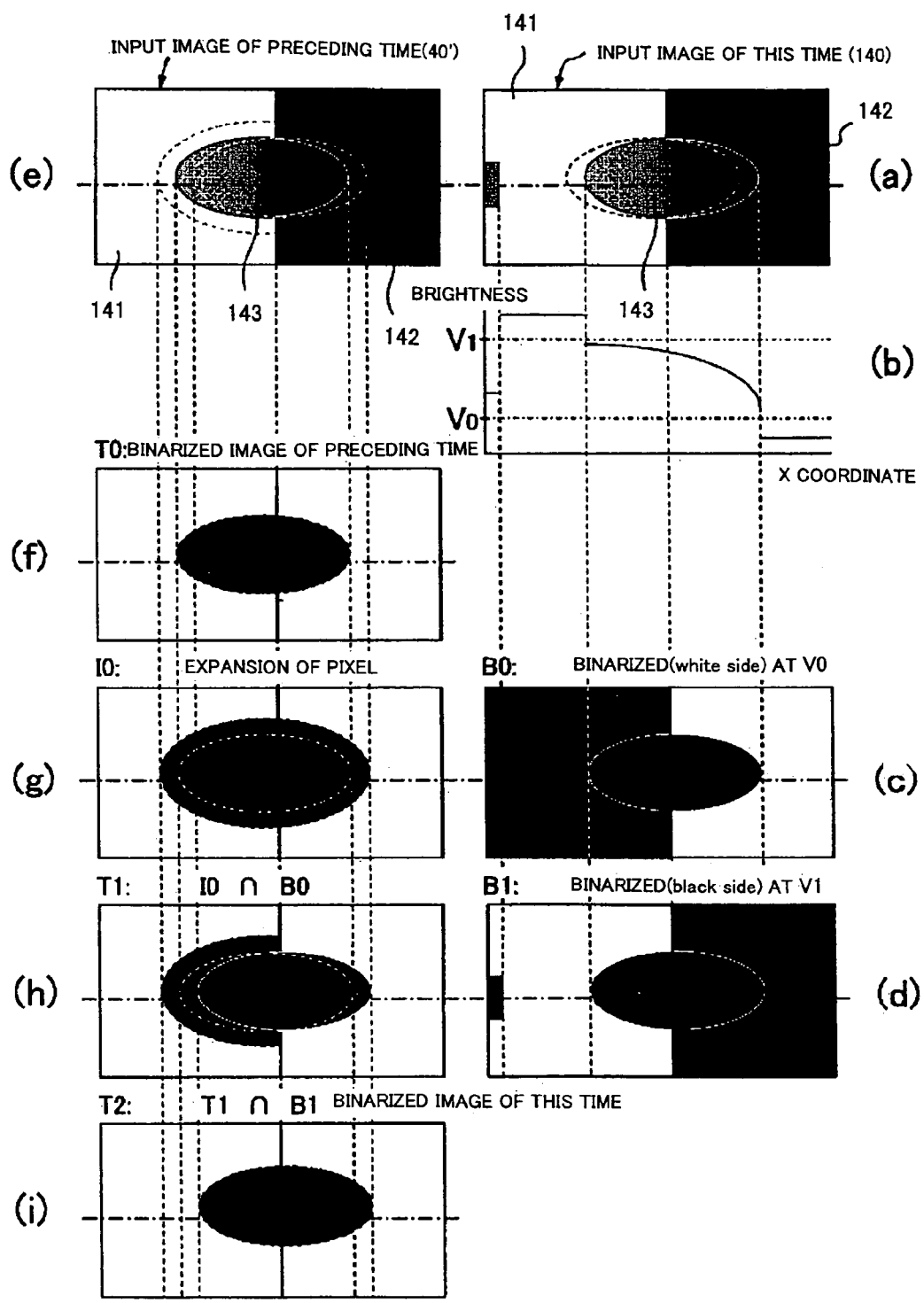
FIGS. 13A to 13I are explanatory views for explaining the operation of the image detection processor related to other embodiment of the present invention.

Next, the operation of the image detection processing element of this embodiment shown in FIGS. 13A to 13I is explained along with FIG. 11 and FIG. 12. For example, in the image processing cycle of this time, it is assumed that an input image 140 shown in FIG. 13A is inputted to the image detection processing elements 1-1 to 1-64 (see FIG. 1). In FIG. 13A, a background is formed such that a left half 141 thereof is bright and has a high brightness and a right half 142 thereof is dark and has a low brightness. This input image 140 includes an image of an object body 143 which has an intermediate brightness and moves from right to left in the backgrounds 141, 142. In FIG. 13E shown at the left side of the input image 140, an input image 40' which is inputted in the preceding image processing cycle is shown. A dotted line in the input image 140 of the image processing cycle of this time indicates the position of the moving object body 143 in the inputted image 40' of the image processing cycle of the preceding time. The small dotted line region in the input image 40' indicates the position of the moving object body 143 in the input image 140 of the image processing cycle of this time and the large dotted line region indicates a window image after the image of the moving object body is expanded by one pixel.

FIG. 13B is a graph showing the brightness of the input image 140 in FIG. 13A, wherein the brightness is taken on an axis of ordinate and the X coordinate is taken on an axis of abscissas. In this embodiment, a threshold value inputter 108 sets two values, that is, a comparatively small value V0 and a comparatively large value V1, as threshold values in a binarization conversion circuit 107 in response to an external signal VREF. These two threshold values V0 and V1 can be arbitrarily selected with respect to the input image and, in this embodiment, the lower limit value V0 and the upper limit value V1 which sandwich the moving object body 143 having the intermediate brightness in the input image are selected.

FIG. 13C shows the result that the binarization conversion circuit 17 converts electric signals of the input image 140 into binarized values, "0" and "1", using the threshold value V0. That is, assuming that the threshold value V0 as a boundary, when the brightness of the input image 140 is lower than this threshold value V0, the electric signal is converted into "0" and, when the brightness of the input image 140 is higher than the threshold value V0, the electric signal is converted into "1". In FIG. 13C, the portion converted into "0" is shown by "white" and the portion converted into "1" is shown by "black". The data which is formed into binarized values by the conversion circuit 107 using the threshold value V0 in such a manner is the data formed into the binarized data focusing on the brighter portions within the input image 140. The data formed into binarized values using the threshold value V0 is selected by the selector 19 when the control signal BW is "0" and is outputted to a conjunction circuit 110. Therefore, the data of FIG. 4C is shown as B0.

FIG. 13D shows the result that, after the binarization conversion circuit 17 forms the electric signals of the input image 140 into binarized values, "0" and "1", using the threshold value V1, "0" and "1" are inverted. That is, it is the result of the processing that, using the threshold value V1 as the boundary, when the brightness of the input image 140 is lower than the threshold value V1, the electric signal is converted into "0" and, when the brightness of the input image 140 is higher than the threshold value V1, the electric signal is converted into "1" and, thereafter, "0" and "1" are inverted. In FIG. 4D, the portion converted into "0" is shown by "white" and the portion converted into "1" is shown by "black". In this manner, the binarized data which is obtained by the binarization performed by the binarization conversion circuit 107 using the threshold value V1 is the data formed into the binarized data focusing on the darker portions within the input image 140. The data formed into binarized values using the threshold value V1 is selected by the selector 109 when the value of the control signal BW is "1" and is outputted to a conjunction circuit 10. Therefore, the data of FIG. 13D is shown as B1.

FIG. 13E shows, as described above, the input image 40' which is inputted in the preceding image processing cycle. FIG. 13F is a binarized image of the object body 143 obtained in the preceding image processing cycle which is extracted from the background and the data "1" is shown by "black" and the data "0" is shown by "white". The data of this FIG. 4F is held in the flip-flop circuit 114 and is shown as data T0 which is outputted from the flip-flop circuit 114 in the image processing cycle of this time. Here, in the first image processing cycle, there is no preceding binarized image of the object body 143 such as shown in FIG. 13F. Therefore, in response to a LOAD signal, the image data corresponding to the object body 143 is directly loaded to the multiplexer 13 from the conjunction circuit 111 and is held in the flip-flop circuit 114.

FIG. 13G shows a data I0 which is obtained by expanding the data T0 of FIG. 13F by only one pixel using the 5-input disjunction circuit body 112a and is outputted from the selector 112b corresponding to the value of the control signal INF. This data 10 which is inputted to the conjunction circuit 110 and is subjected to the conjunction (AND) operation processing with the binarized data B0 of FIG. 13C which is inputted from the selector 109 to the conjunction circuit 110. The result of the conjunction (AND) operation processing is shown in FIG. 13H. The data of the result of the conjunction (AND) operation processing shown in FIG. 13H is held in the flip-flop circuit 114 and is outputted as the data T1.

In the next operation, in the 5-input conjunction circuit 112, the control signal INF selects and outputs only the output from the own flip-flop circuit 114 of the image detection processing element thereof using the selector 112b. Therefore, from the 5-input conjunction circuit 112, the data T1 shown in FIG. 13H is outputted as an output I. The conjunction circuit 110 performs the conjunction (AND) operation processing of the data T1 and the data B1 which is formed into binarized values using the threshold value V1 which is outputted from the selector 109 and inverted.

FIG. 13I shows the result of this conjunction (AND) operation processing. The result of the conjunction (AND) operation processing is shown as a data T2 and is held in the flip-flop circuit 114. This data T2 is the binarized image ("1" indicated in "black", "0" indicated in "white") which is obtained by extracting an image of the moving object body obtained by the image processing cycle of this time from the background. As shown in the data T2, the object body image 143 which has the intermediate brightness and moves within the background having contrast can be extracted and used for the arithmetic operation of the position of the center of gravity described later.

Figure 14:
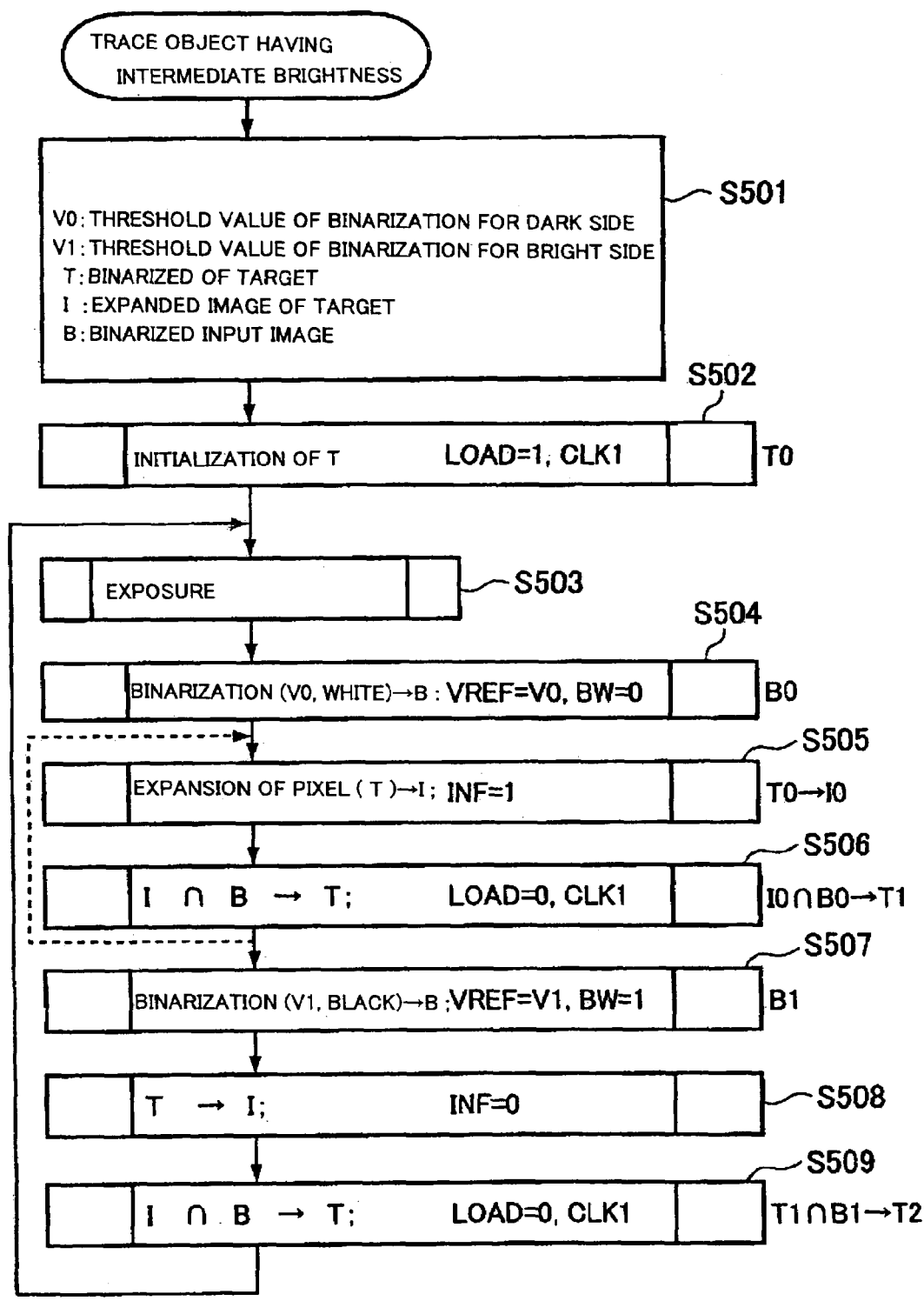
FIG. 14 is a flowchart for explaining the operation of the image detection processor related to other embodiment of the present invention.

Next, referring to a flowchart shown in FIG. 14, the image processing method for extracting and tracing a body having an intermediate brightness explained in FIGS. 13A to 13I from the background is explained. First of all, two threshold values V0 and V1 are set. Then, a binarized image T as a target obtained by extracting the moving object body from the background, an expanded image thereof (comparative object signals) I and an input image B which is formed into binarized values respectively with two threshold values, V0 and V1, are initially set. (step 501). The binarized image of a target T0 is initialized (step 502). First, since the LOAD signal to the multiplexer 113 becomes "1", the binarized image data T0 as the target is loaded from the conjunction circuit 111 and is held in the flip-flop circuit 114. Next, the exposure is performed (step 503).

Then, using the lower threshold value (VREF) V0, the binarized input image B0 is selected by the selector 9 in response to the control signal BW=0 and is outputted. (step 504).

The expanded image 10 which is obtained by expanding the binarized image T0 as the target which is held in the flip-flop circuit 114 by only one pixel is selected by the selector 112b in response to the control signal INF=1 and is outputted as a comparative object signal (step 505).

The expanded image 10 which constitutes the comparative object signal is, in the conjunction circuit 110, subjected to the conjunction (AND) operation processing together with the binarized input image B0 and the binarized data T1 which constitutes the target of the result thereof is held in the flip-flop circuit 114. (step 506). If the moving speed of the object body is high and hence, the image of the object body moves by 2 pixels or more until the next image processing cycle, a loop shown by a dotted line is repeated by the number of moving pixels.

Next, the input image B1 which is binarized using the higher threshold value (VREF) V1 and, thereafter inverted is selected in the selector 9 in response to the control signal BW=1 and is outputted to the conjunction circuit 110. (step 507). Then, from the 5-input disjunction circuit 112, the output T1 from the own flip-flop circuit 114 of the image detecting processing element thereof is outputted to the conjunction circuit 110 in response to the control signal INF=0 of the selector 112b (step 508) Then, in the conjunction circuit 110, the conjunction (AND) operation processing of the binarized input image data B1 and the data T1 is performed to obtain a binarized image T2 of a target which is held in the flip-flop circuit 114. Then, using this binarized image T2 as the target, next image processing cycle is repeated. The binarized image T2 is the image obtained by extracting the moving object body having an intermediate brightness from the background having contrast and can be used for the center-of-gravity operation processing of the object body image.

Figure 15:
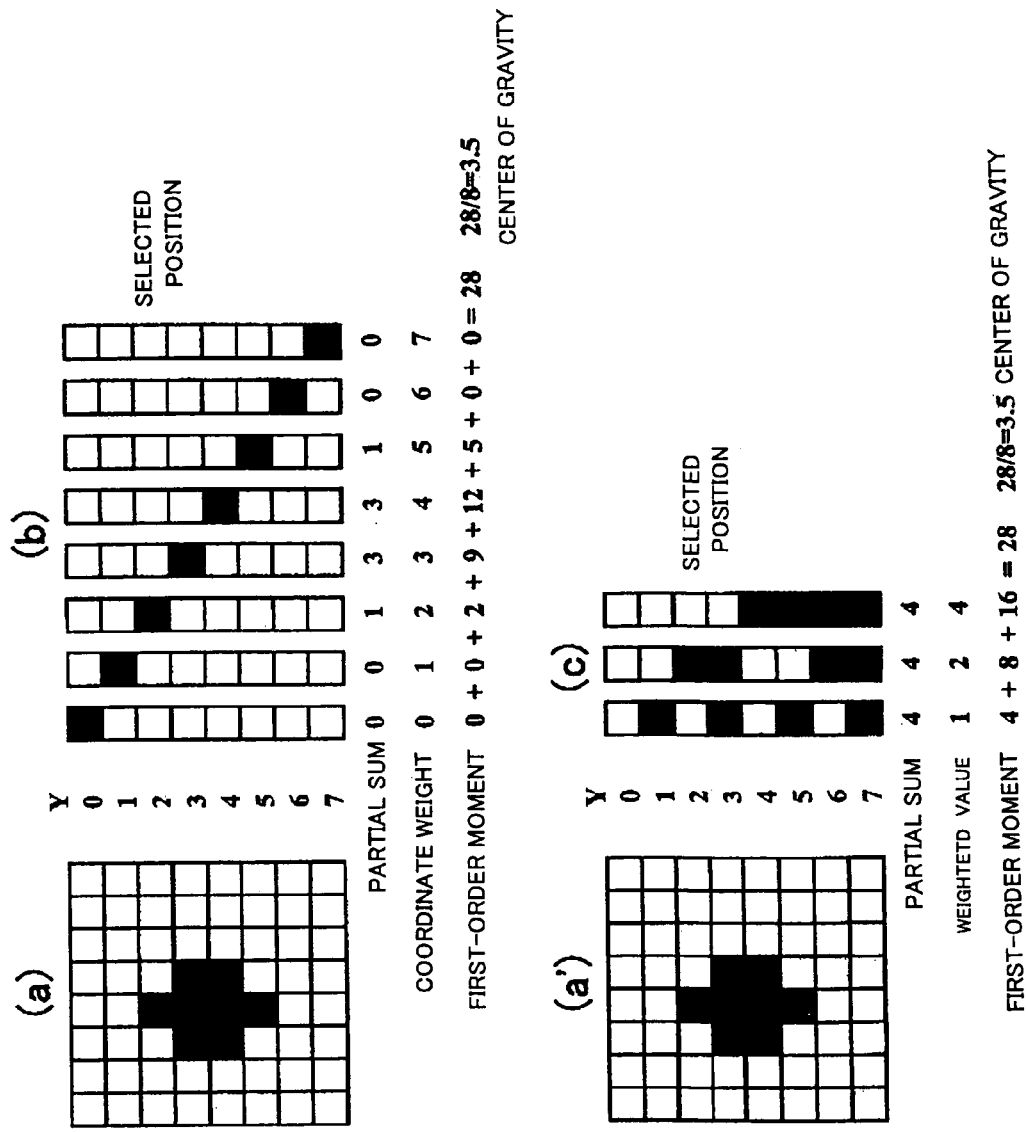
FIGS. 15A to 15C are explanatory views explaining a method for calculating the center of gravity of a target related to other embodiment of the present invention.

Next, referring to FIGS. 15A to 15C, the operation that the binarized image of the object body having an intermediate brightness and moving within the background having a contrast is extracted from the background and thereafter, the center-of-gravity position of the image of the object body is calculated is explained. For example, the binarized image of the object body which is extracted from the background is shown in FIG. 15A. "Black" in FIG. 15A corresponds to the pixel "1" of the binarized image showing the object body. The center-of-gravity position of the image of the object body can be calculated based on the area obtained by simply adding pixels having the value "1" in the object body image within the screen (0-order moment) and a value of a first-order moment about the Y axis (axis of ordinate) and the X axis (axis of abscissas) obtained by multiplying distance (can be obtained from the row number or the column number of the pixel) from the Y axis or the X axis in the screen as weighting to "1" of the pixel and adding.

With respect to the area (O-order moment) of the object body image, when the values of cumulative addition obtained by the first adders (see FIG. 2) included in respective detecting processing elements 1-1 to 1-64 for respective rows of the screen of FIG. 15A are added by the serial adders 2-1 to 2-8 (see FIG. 1), from the last serial adder 2-8, the area (O-order moment) as the sum(8) of the pixels "1" in the screen of the object body which is extracted from the background is outputted. The 1-order moment taken on the X axis (axis of abscissas) of the object body image uses the row numbers 0 to 7 which are taken on the ordinate (Y) axis of FIG. 15B as the distance from the X axis(axis of abscissas) (weighting, shown as coordinate weighting in the drawing). Then, the partial sums (0, 0, 1, 3, 3, 1, 0, 0) of cumulative addition for respective rows by the first adders included in respective image detection processing elements 1-1 to 1-64 is, due to the operation of the row decoder circuit 3 and the column decoder circuit 4, taken out to the serial adders 2-1 to 2-8 respectively and outputted. Then, by performing the calculation to add weighting of respective row numbers 0 to 7 to the partial sums thus obtaining the total sum, the first-order moment about the X axis is calculated. (That is, 0+0+2+9+12+5+0+0=28.) The first-order moment about the Y axis is calculated in the similar manner. Based on these data, the center-of-gravity position of the image of the moving object body which is extracted from the background can be calculated. Here, the calculating operation of the above-mentioned area (0-order moment) and the first-order moment is identical to the corresponding calculation described in detail in the previously-mentioned Patent Document 1.

Here, the more preferable method of the calculation operation of the first-order moment is explained. As shown in FIG. 15C, a partial sum (that is, 4 in the object body shown in FIG. 15A of the cumulative adding for respective rows obtained by the first adders in the respective image detecting processing elements corresponding to the row numbers 1, 3, 5 and 7, a partial sum (that is, similarly 4) of the cumulative adding for respective rows obtained by the first adders in the respective image detecting processing elements corresponding to the row numbers 2, 3, 6 and 7 and partial sum (that is, similarly 4) of the cumulative adding for every row obtained by the first adders in the respective image detecting processing elements corresponding to the row numbers 4 to 7 are obtained. Then, weightings 1, 2, 4 are respectively multiplied to these partial sums respectively whereby the first-order moment about the X axis is obtained. Due to such an operation, outputting of only three times of the partial sums from the image detection processing element is sufficient. Further, with respect to the calculation of multiplying of the weightings of 1, 2, 4, since the calculation is replaced by shifting in binary number, the multiplication becomes unnecessary and the calculation becomes simple whereby the further high-speed processing can be performed. The center-of-gravity position of the image of the moving object body calculated in the above-mentioned manner is used for other information devices and control devices for tracing and controlling the moving object body.

As explained above, according to the device or the method of this embodiment, the image processing of the object body having an intermediate brightness and moving within the background having contrast or brightness and darkness can be performed using the binarization circuit having the simple constitution. Since the circuit constitution of the image detection processing element is simple, the processing speed can be enhanced.

Next, another embodiment according to the present invention is explained. In the image detection processor of this embodiment has the substantially equal schematic constitution as the image detection processor shown in FIG. 1. The first adders in the respective image detection processing elements and the constitution of the serial adders 2-1 to 2-8 are also similar to those shown in FIG. 2, FIG. 3. Further, the constitutions of the converters within the respective image detection processing elements are similar to those shown in FIG. 12 and FIGS. 13A to 13I and explained in the above-mentioned embodiments. Accordingly, with respect to these constitutions, FIG. 1 to FIG. 3, FIG. 12, FIGS. 13A to 13I and their explanations are to be referred to and hence, the explanation thereof is omitted in this embodiment.

In this embodiment, the image detection processor is used as a vision sensor of a robot, a safety device of a machine tool or the like and judges whether the normal state is displayed or not based on the inputted image data. To be more specific, when the image detection processor is used as the safety device of the machine tool, from the inputted image data, an abnormal state that a part of a human body such as a hand or the like enters within the danger zone or the like is automatically judged with high accuracy and the safety device can be automatically operated.

FIGS. 16A to 16E are views showing a method for obtaining the multiple gray scale brightness of the input image by binarizing respective input data based on different threshold values using the image detection processing elements.

Figure 16:
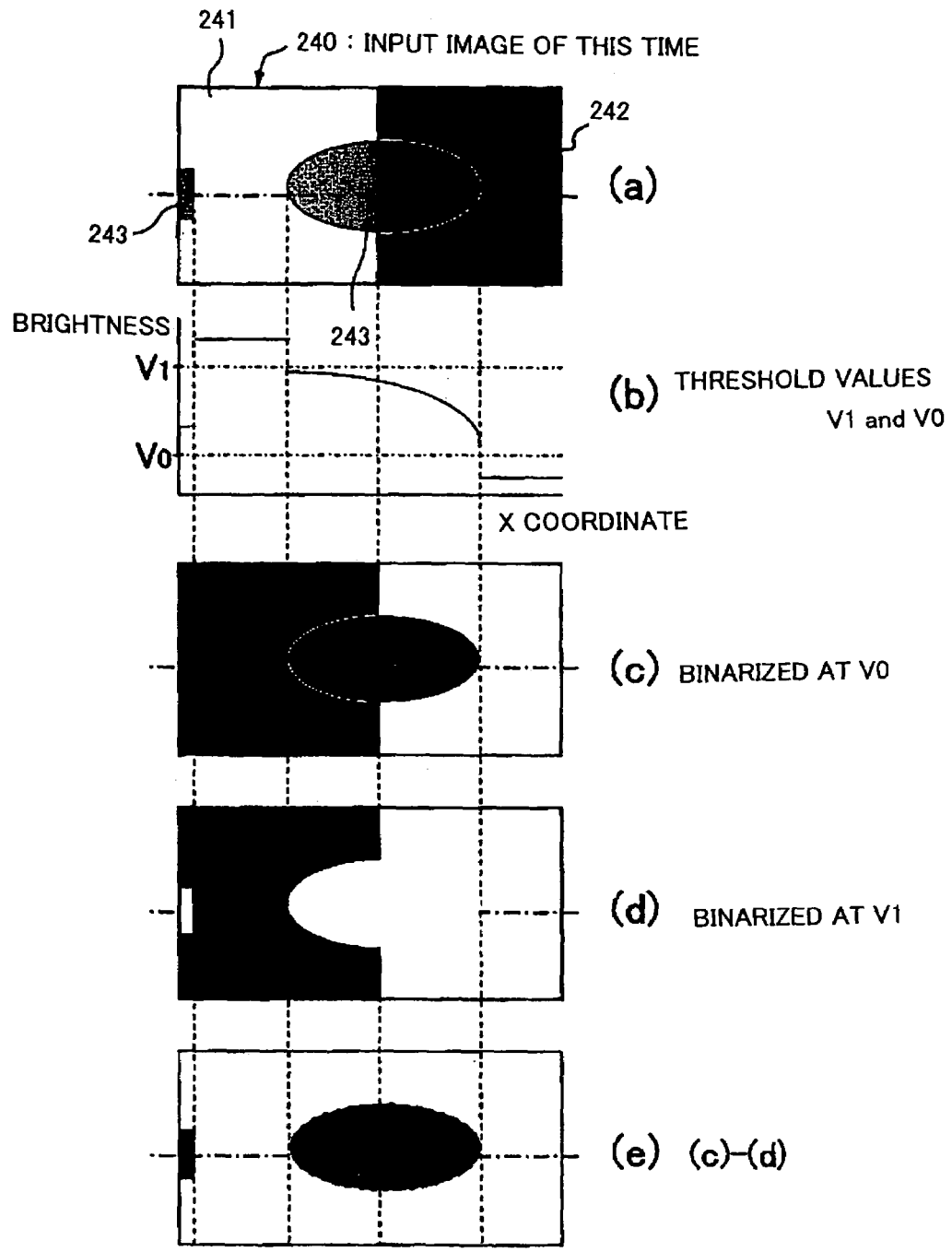
FIGS. 16A to 16E are explanatory views for explaining the operation of the image detection processor related to other embodiment of the present invention.

Referring to FIGS. 16A to 16E, an input image 240 is shown in FIG. 16A. The input image 240 includes a bright portion 241 having a high brightness, a dark portion 242 having a low brightness and a portion 243 having an intermediate brightness. In FIG. 16B, the axis of abscissas is taken on the X axis and a chained line indicative of the center of the input image 240 shown in FIG. 16A is taken on the axis of abscissas and the strength of the brightness is taken on the axis of ordinates. Then, two threshold values V0, V1 which are set in response to the external signal VREF (see FIG. 11) are shown. The smaller threshold value V0 corresponds to the dark light quantity and the larger threshold value V1 corresponds to the bright light quantity.

In FIG. 16C, the data obtained by binarizing the input image 240 shown in FIG. 16A to either "0" or "1" using the converting circuit 107 (see FIG. 11) based on the threshold value V0 is shown. In FIG. 16C, the portion corresponding to "0" of the binarized data is shown by "white" and the portion corresponding to "1" of the binarized data is shown by "black". In FIG. 16D, the data obtained by binarizing the input image 240 of FIG. 16A to either "0" or "1" using the converting circuit 10.7 based on the threshold value V1 is shown. In FIG. 16D also, the portion corresponding to "0" of the binarized data is shown by "white" and the portion corresponding to "1" of the binarized data is shown by "black".

FIG. 16E shows the result obtained by subtracting the data shown in FIG. 16C and FIG. 16D. FIG. 16E corresponds to the intermediate brightness portion 243 shown by the binarized data "1" in the input image 240. By obtaining the sum (area) of the portions indicated by the binarized data "1" in FIG. 16D, the area of the portion 241 which has a highest brightness in the inputted image 240 can be obtained. By calculating the sum (area) of the portions shown by the binarized data "1" in FIG. 16C and by calculating the difference of the sum and the sum (area) of the portions shown by the binarized data "1" in FIG. 16D, the area of the portion shown by "1" in FIG. 16E can be obtained. Accordingly, the area of the intermediate brightness portion 243 (portion of FIG. 16E shown by "1") in the input image 240 can be obtained. Then, by outputting the inverted binarized data of FIG. 16C, that is, by subtracting the sum (area) of portions shown by "1" from whole pixel number (whole area), the area of the portion 242 having the lowest brightness in the input image 240 can be obtained.

In such a manner, the areas of three portions 241, 242, 243 which have different brightness in the input image 240 can be obtained.

Although described later, using the image areas induced in such a manner, based on the change of distribution of the areas having different brightness in the input image, it is possible to judge with high accuracy and at a high speed whether the input image displays a normal state or displays an abnormal state. The judging means which performs such judgment is configured to be connected so as to receive the output of the serial adder 2-8 shown in FIG. 1. In FIG. 1, the output of the serial adder 2-8 is inputted to the edge coordinate detection means 70, however, instead of this edge coordinate detection means 70, the above-mentioned judging means may be mounted.

Figure 17:
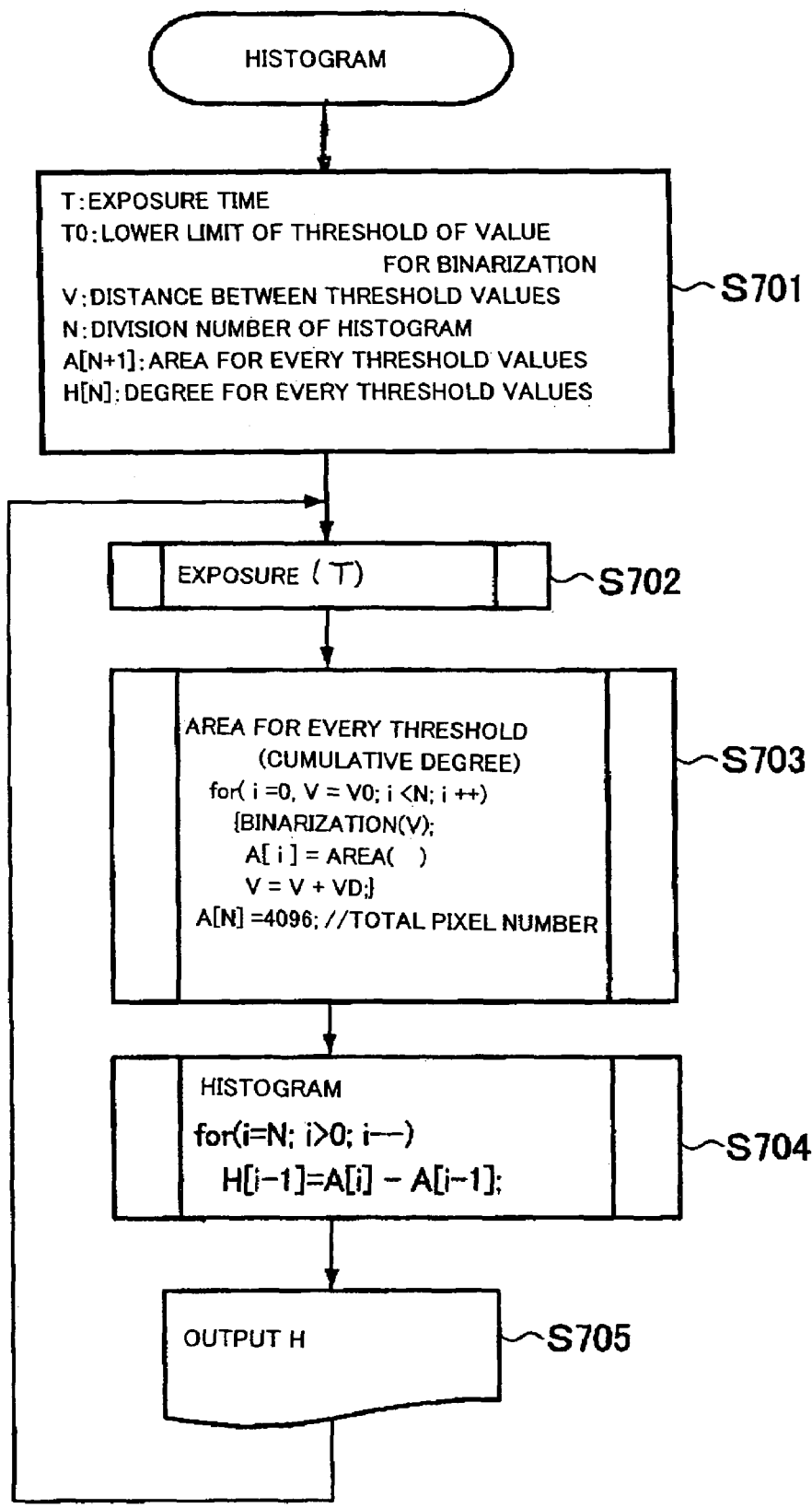
FIG. 17 is a flowchart for making a brightness histogram of input image using the image detection processor related to other embodiment of the present invention.

Next, referring to FIG. 17, the steps for obtaining the brightness distribution of the input image which are performed by a host computer such as a personal computer or the like is explained in detail. FIG. 17 is a flowchart explaining the means for obtaining histogram of the brightness distribution of the pixels in the input image. In the image detection processor of this embodiment, the image detection processing element is arranged on a plane as a matrix array (array) of 64×64 and the whole pixel number is 64×64, that is, 4096 in total. First of all, in the initialization (step 701), an exposure time T, a lower limit V0 of the threshold value at the time of binarizing the brightness in the input image, a gap VD between threshold values and a dividing number N of histogram are set. Then, the area A[N+1] for respective threshold values and frequency numbers H[N] for respective threshold values are initialized to zero. After the exposure time T is over, the input image is fetched. (step 702). Then, the areas (cumulative number) A[i] for respective threshold values in the input image are calculated by the above-mentioned method.

With respect to the area A[i] for every threshold value in the input image, to the value of the threshold value V, the threshold value gap VD is added until i reaches the dividing number N of the histogram. Then, the whole area A[N] becomes equal to the whole pixel number (step 703). Thereafter, the frequency number H[N] of the histogram for every threshold value is calculated. With respect to the calculation, by subtracting A[i−1] from the area A[i] for every neighboring threshold value having a threshold gap therebetween, the frequency number H[i−1] of pixels which exists within the range of the threshold value gap can be obtained. This calculation is performed until i reaches the dividing number N of the histogram. (step 704). Further, the obtained histogram is outputted (step 705) and the processing returns to the exposure step (step 702) for the next processing cycle.

Next, referring to FIGS. 18A to 18D, steps for judging whether the input image which reflects the monitoring region such as a danger zone or the like displays a normal operation state or displays an abnormal state in which a human hand or the like enters in the danger zone by the change of the brightness distribution of the input image performed by a host computer such as a personal computer or the like is explained in detail. FIGS. 18A to 18D is a flowchart of a method for obtaining the histogram of the brightness portion of the input image.

FIG. 18A is an input image displaying a monitoring area 280 within the danger zone of the machine tool. FIG. 18B is a distributed state of the histogram of the brightness distribution of the input image when only a mold is present within the monitoring area or region 280. FIG. 18B shows a distribution state of the histogram in the brightness distribution when only the mold and the work which constitutes a forming object are present within the monitoring area 280. Further, FIG. 18C is a distributed state of the histogram of the brightness distribution of the input image when a human hand (foreign object) is inserted besides the mold and the work within the monitoring area 280.

From the distributed state of the histogram of the brightness distribution, it is understood that, when the human hand (foreign object) is inserted besides the mold and the work, the dispersion of the distributed state of FIG. 18D of the histogram becomes high. This is because that, when a body which is 3-dimentionally complicated such as a human hand or the like enters within the monitoring region such as the danger zone or the like, complicated shades are generated and the dispersion of the distributed state of the output data which expresses the brightness of the image data which reflects the region is increased. Accordingly, when the dispersion of the distributed state of the histogram of the brightness distribution of the input image is higher than the normal state in which only the mold and the work exist, i.e., when the degree of dispersion of the distribution state of the histogram of the brightness distribution is above a predetermined degree, it can be judged that the input image displays an abnormal state. By this means, generation of an accident can be obviated in advance by performing the emergency stop on the machine tool.

Here, various modifications can be applied to the present invention. For example, when the brightness of the background differs due to lighting or the like, the present invention can be applied to chase a man moving in the background. With respect to the binarized image, it is impossible to detect the moving body within the background having complicated brightness pattern since the background and the moving body are difficult to distinguish. However, when the body moves within the region, the histogram (cumulative frequencies of respective brightness) showing the brightness distribution within the region also changes. Accordingly, with respect to the change of the histogram (cumulative frequencies of respective brightness) of the brightness distribution within the region, moving of the body within the image can be detected. Hereinafter, the steps for detecting the moving body within the background having different brightness are explained.

First of all, the reference screen (or the immediately previous input screen) is taken into the image detection processor, the screen is divided by the lines in the lateral (X) direction (or divided into several lines of rectangular regions) and the histogram of the brightness (cumulative frequencies of respective brightness) for every line (every rectangular region) is obtained.

Next, the input image is taken into the image detection processor, similarly, the input image is divided by the lines in the horizontal (X) direction (or divided into several lines of rectangular regions) and the histogram of the brightness (cumulative frequencies of respective brightness) for every line (every rectangular region) is obtained.

Then, the histogram (cumulative frequencies of respective brightness) of the brightness obtained from the input image is compared with the histogram of the reference screen (or the just-previously inputted screen) sequentially from the bottom in the vertical (Y) coordinate. As the result of the comparison, the vertical (Y) coordinate position at which the first histogram (cumulative frequencies of respective brightness) having different brightness from the reference screen (or the previous screen) is firstly obtained indicates the vertical (Y) coordinate value of the lower end of the moving body. Similarly, by obtaining the vertical (Y) coordinate value, the right (X) coordinate value, the left (X) coordinate value of an upper end of the object, the circumscribed rectangular region of the moving body can be obtained. Based on the coordinate values of the circumscribed rectangular region of the moving body such as a man or the like which is obtained in such a manner, an external safety device or an alarming device can be operated.

As explained heretofore, according to this embodiment, the distribution state of the brightness of the input image data which reflects the monitoring region such as the danger zone or the like is obtained and, based on the brightness distribution state, the display state of the input image data, for example, whether the input image displays a normal state or displays an abnormal state can be judged with high accuracy and at a high speed.

What is claimed is:

1. An image detection processor comprising:
   a plurality of image detection processing elements arranged in a matrix array so that an object body image can be focused thereon, each of the image detection processing elements including a photo detector which performs a photoelectric conversion, a converter which converts signals from the photo detector into digital signals, and an adder which allows inputting of the digital signals thereinto;
   cumulative adders which are constituted by sequentially connecting adders in the plurality of image detection processing elements;
   a control circuit which allows selective inputting of the digital signals of the plurality of image detection processing elements to the cumulative adders; and
   edge coordinate detection means for selecting the digital signals of the image detection processing elements in a row unit or in a column unit in the matrix array by the control circuit and detecting an edge coordinate of the object body image based on processed data obtained by the cumulative adders.

2. An image detection processor comprising:

a plurality of image detection processing elements arranged in a matrix array for detecting an input image, each image detection processing element including a photo detector which performs photoelectric conversion of the input image, a converter which converts output image data signals output from the photo detector into digital signals, and adders which allow inputting of the digital signals thereto;

cumulative adders which sequentially connect the adders of the plurality of image detection processing elements and from which image data is outputted;

a control circuit which allows the digital signals of the plurality of image detection processing elements to selectively be inputted to the cumulative adders; and judging means for judging a display state of the image data based on a distribution state of the output image data which is detected and output by the photo detectors and is indicative of brightness of the image data outputted from the cumulative adders, the judging means measuring a degree of dispersion of the distribution state of the output image data indicative of brightness and judging that the image data represents an abnormal state when the degree of dispersion is above a predetermined degree.

3. An image detection processor according to claim 2, wherein the converter of each image detection processing element converts the signals from the photo detector into binarized signals based on a plurality of threshold values, respectively, the cumulative adders output the output image data indicative of the brightness of the image data as the sum of the binarized signals, and the judging means obtains the difference of the sums for respective threshold values, and the distribution state is obtained based on the difference of the sums.

* * * * *